United States Patent
Trindade et al.

(10) Patent No.: US 11,626,856 B2
(45) Date of Patent: Apr. 11, 2023

(54) NON-LINEAR TETHERS FOR SUSPENDED DEVICES

(71) Applicant: X-Celeprint Limited, Dublin (IE)

(72) Inventors: António José Marques Trindade, Cork (IE); Raja Fazan Gul, Cork (IE); Lei Liu, Cork (IE); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 205 days.

(21) Appl. No.: 17/006,498

(22) Filed: Aug. 28, 2020

(65) Prior Publication Data

US 2021/0135649 A1    May 6, 2021

Related U.S. Application Data

(63) Continuation-in-part of application No. 16/669,499, filed on Oct. 30, 2019.

(51) Int. Cl.
*H03H 9/02* (2006.01)
*H01L 41/09* (2006.01)
*H03H 9/15* (2006.01)

(52) U.S. Cl.
CPC ..... *H03H 9/02338* (2013.01); *H01L 41/0926* (2013.01); *B81B 2201/03* (2013.01); *H03H 2009/155* (2013.01)

(58) Field of Classification Search
CPC .......... B81B 2201/03; H03H 2009/155; H03H 9/02157; H03H 9/02228; H03H 9/13;

(Continued)

(56) References Cited

U.S. PATENT DOCUMENTS

| 6,142,358 A | 11/2000 | Cohn et al. |
| 7,195,733 B2 | 3/2007 | Rogers et al. |

(Continued)

FOREIGN PATENT DOCUMENTS

| WO | WO-2012027458 A1 * | 3/2012 | ............. G01R 31/26 |
| WO | WO-2018002439 A1 * | 1/2018 | ........... B81B 3/0081 |

OTHER PUBLICATIONS

Bower, C. A. et al., Micro-Transfer-Printing: Heterogeneous Integration of Microscale Semiconductor Devises using Elastomer Stamps, IEEE Conference, (2014).

(Continued)

*Primary Examiner* — Lana N Le
(74) *Attorney, Agent, or Firm* — Choate, Hall & Stewart LLP; Michael D. Schmitt

(57) ABSTRACT

A suspended device structure comprises a substrate, a cavity disposed in a surface of the substrate, and a device suspended entirely over a bottom of the cavity. The device is a piezoelectric device and is suspended at least by a tether that physically connects the device to the substrate. The tether has a non-linear centerline. A wafer can comprise a plurality of suspended device structures. A device structure can comprise a device over a sacrificial portion or cavity and a tether with a tether opening extending to the sacrificial portion or cavity. The tether or tether opening can have a T shape. The tether can have a tether length at least one third as large as a device length and the device can have a device length at least twice as large as a device width.

20 Claims, 28 Drawing Sheets

(58) Field of Classification Search
CPC ...... H03H 9/132; H03H 9/173; H03H 9/2452; H03H 9/02338; H01L 41/053; H01L 41/0926; H01L 21/6835; H01L 2224/24; H01L 2224/97; H01L 24/83; H01L 2221/68381; H01L 24/24; H01L 2221/6835; H01L 24/97; H01L 2924/15153; H01L 21/481; H01L 25/16; H01L 24/30; H01L 21/76898; H01L 2224/82005; H01L 2221/68318

See application file for complete search history.

(56) References Cited

U.S. PATENT DOCUMENTS

| | | | |
|---|---|---|---|
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 8,333,860 B1 | 12/2012 | Bibl et al. | |
| 8,470,701 B2 | 6/2013 | Rogers et al. | |
| 8,558,243 B2 | 10/2013 | Bibl et al. | |
| 8,791,474 B1 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,049,797 B2 | 6/2015 | Menard et al. | |
| 9,087,764 B2 | 7/2015 | Chan et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,161,448 B2 | 10/2015 | Menard et al. | |
| 9,165,989 B2 | 10/2015 | Bower et al. | |
| 9,166,114 B2 | 10/2015 | Hu et al. | |
| 9,178,123 B2 | 11/2015 | Sakariya et al. | |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,355,854 B2 | 5/2016 | Meitl et al. | |
| 9,358,775 B2 | 6/2016 | Bower et al. | |
| 9,367,094 B2 | 6/2016 | Bibl et al. | |
| 9,412,727 B2 | 8/2016 | Menard et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,589,944 B2 | 3/2017 | Higginson et al. | |
| 9,601,356 B2 | 3/2017 | Bower et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 9,991,863 B1 | 6/2018 | Kubena et al. | |
| 10,389,392 B1 | 8/2019 | Kubena et al. | |
| 10,832,934 B2* | 11/2020 | Trindade | B41F 16/0046 |
| 11,088,007 B1 | 8/2021 | Fecioru | |
| 2003/0117369 A1 | 6/2003 | Spitzer et al. | |
| 2003/0141570 A1 | 7/2003 | Chen et al. | |
| 2010/0306993 A1 | 12/2010 | Mayyas et al. | |
| 2013/0309792 A1 | 11/2013 | Tischler et al. | |
| 2013/0316487 A1 | 11/2013 | de Graff et al. | |
| 2014/0159043 A1 | 6/2014 | Sakariya et al. | |
| 2015/0371874 A1 | 12/2015 | Bower et al. | |
| 2016/0093600 A1 | 3/2016 | Bower et al. | |
| 2017/0310299 A1* | 10/2017 | Bower | H03H 9/545 |
| 2017/0338374 A1 | 11/2017 | Zou et al. | |
| 2018/0031974 A1* | 2/2018 | Prevatte | H05K 3/305 |
| 2018/0042110 A1* | 2/2018 | Cok | H01L 25/16 |
| 2018/0048284 A1* | 2/2018 | Nakamura | H03H 9/2452 |
| 2018/0130829 A1* | 5/2018 | Bower | H01L 29/78666 |
| 2018/0278228 A1 | 9/2018 | Hurwitz | |
| 2019/0074811 A1* | 3/2019 | Nishimura | H03H 9/02 |
| 2020/0176286 A1* | 6/2020 | Rotzoll | H01L 41/0815 |
| 2020/0176671 A1* | 6/2020 | Cok | H03H 9/54 |
| 2020/0283291 A1 | 9/2020 | Krishna et al. | |
| 2021/0135648 A1 | 5/2021 | Trindade et al. | |
| 2022/0112078 A1 | 4/2022 | Rubino et al. | |

OTHER PUBLICATIONS

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits. Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Piazza, G. et al., Piezoelectric Aluminum Nitride Vibrating Contour-Mode MEMS Resonators, Journal of Microelectrochemical Systems, 15(6):1406-1418, (2006).

Trindade, A.J. et al., Precision transfer printing of ultra-thin AlInGaN micron-size light-emitting diodes, Crown, pp. 217-218, (2012).

* cited by examiner

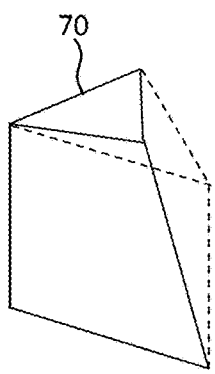
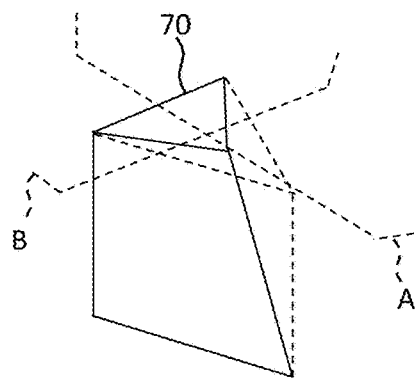
FIG. 28A
FIG. 28B
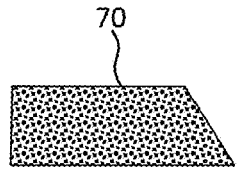
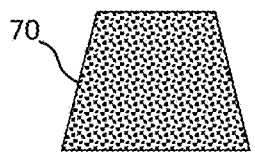
FIG. 28C
FIG. 28D
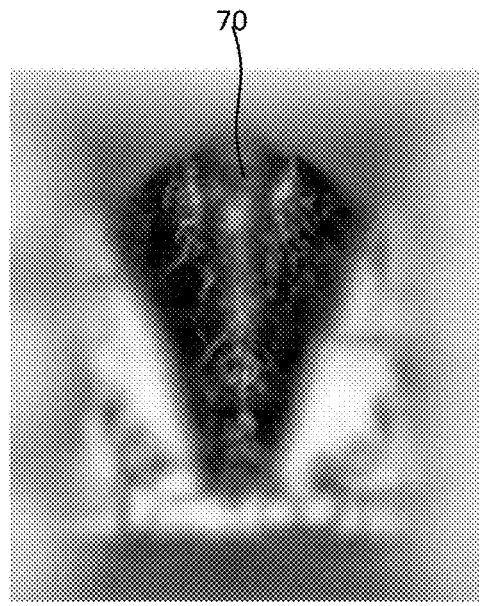
FIG. 29

NON-LINEAR TETHERS FOR SUSPENDED DEVICES

PRIORITY APPLICATION

This application is a continuation-in-part of U.S. patent application Ser. No. 16/669,499, filed on Oct. 30, 2019, which is incorporated by reference herein in its entirety.

TECHNICAL FIELD

The present disclosure generally relates to structures for suspending devices (e.g., micro-electro-mechanical piezo-electric acoustic resonator micro-devices) on substrates and to source wafers having component tether structures.

BACKGROUND

Micro-electro-mechanical systems (MEMS) incorporate a wide variety of micro-devices used in mechanical systems that are typically provided on device substrates and constructed using photolithographic methods and materials found in the integrated circuit and semiconductor foundry industries. For example, surface and bulk acoustic wave filters formed in piezo-electric materials filter applied electronic signals by converting the electronic signals to acoustic waves in the piezo-electric materials. The acoustic waves resonate at frequencies dependent on the device structure and are then output as filtered electronic signals whose frequencies correspond to the resonant acoustic waves. Thin-film bulk acoustic resonators use piezo-electric films having thicknesses in the micron and sub-micron range. Both surface and bulk acoustic resonators are typically formed on and in contact with device substrates. The presence of the device substrate can dampen the acoustic waves or require acoustic isolation from the surrounding medium, for example using acoustic reflectors (e.g., acoustic mirrors).

A piezo-electric device suspended over a cavity in a device substrate provides a device structure that is mostly free to oscillate independently of the device substrate, for example as described in "Piezoelectric Aluminum Nitride Vibrating Contour-Mode MEMS Resonators" by Gianluca Piazza, Philip J. Stephanou, and Albert P. Pisano, Journal of Microelectrochemical Systems, Volume 15, Issue 6, December 2006, pp. 1406-1418. Such a suspended device can be supported over the cavity by one or more tethers provided to anchor the device to corresponding locations on walls or edges of the cavity leaving the remainder of the device free to vibrate. The devices are formed on a silicon substrate and released from the silicon substrate with an $XeF_2$ dry etch used to form the cavity. Such an etch process and chemistry can, however, be difficult to use and problematic in and with some device substrate materials and structures. For example, $XeF_2$ can be incompatible with metals that are useful for electrodes used in piezo-electric devices, requiring additional protective encapsulation layers and consequent pre-process steps. Furthermore, $XeF_2$ etching can cause physical stress to the tethers, to the devices, or to both the tethers and the devices, possibly damaging or destroying them.

There is a need, therefore, for alternative structures, methods, and materials for making piezoelectric resonators and, more generally, for making suspended micro-electro-mechanical devices that, for example, benefit from increased mechanical isolation (e.g., micro-electro-mechanical (MEM) devices).

Substrates with electronically active devices distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active devices are typically either assembled on the substrate, for example using individually packaged surface-mount integrated-circuit components and pick-and-place tools, or by coating a layer of semiconductor material on the substrate and then photolithographically processing the semiconductor material to form thin-film circuits on the substrate. Individually packaged integrated-circuit components typically have smaller transistors with higher performance than thin-film circuits but the packages are larger than can be desired for highly integrated systems.

Methods for transferring small, active devices (e.g., components) from one substrate to another are described in U.S. Pat. Nos. 7,943,491, 8,039,847, and 7,622,367. In these approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Stamps comprising many individual posts can transfer many thousands of chiplets in a single transfer operation. It is important, therefore, to carefully control the etching and printing process, for example by carefully controlling the component, anchor, and tether structures, to micro-transfer print systems at a high yield with reduced costs. Thus, there is a need for structures, methods, and materials for constructing, releasing, and printing chiplets from a source wafer to a non-native target substrate.

SUMMARY

The present disclosure provides, inter alia, structures having devices suspended over bottoms of cavities in a substrate. Suspended devices can have improved mechanical isolation as compared to devices disposed on a substrate surface. By using non-linear tethers to connect devices to a substrate, etching of the substrate to form cavities under the devices can be improved such that imperfections or damage to the devices is reduced or eliminated.

In some aspects, the present disclosure is directed to a suspended device structure comprising: a substrate; a cavity disposed in a surface of the substrate; and a device suspended entirely over a bottom of the cavity, the device comprising a piezoelectric material. The device is suspended at least by a tether that physically connects the device to the substrate, for example in a tether direction extending from an edge of the device to an edge of the cavity, and the tether has a non-linear centerline. A non-linear centerline comprises two or more points (e.g., has two or more portions) that are non-collinear with each other. The centerline can comprise a plurality of straight-line segments, at least a portion of the centerline can be curved, or the centerline can form an acute or obtuse angle.

According to some embodiments, the tether comprises a tether device portion having a tether device portion centerline that extends from the device and a tether substrate portion having a tether substrate portion centerline that extends from the substrate. The tether substrate portion is physically connected to the tether device portion, and the tether device portion centerline is non-collinear with the tether substrate portion centerline.

According to some embodiments, (a) the tether device portion centerline is a line segment that is straight, (b) the tether substrate portion centerline is a line segment that is straight, or (c) both (a) and (b). According to some embodiments, (a) the tether device portion centerline extends substantially orthogonally to an edge of the device; (b) the tether substrate portion centerline extends substantially orthogonally to an edge of the cavity; or (c) both (a) and (b). According to some embodiments, the tether device portion centerline is separated from the tether substrate portion centerline by a distance that is at least twice a minimum of a width of the tether in a direction orthogonal to at least one of the tether device portion centerline and the tether substrate portion centerline. The direction can be, but is not necessarily, parallel to an edge of the device or an edge of the cavity. The distance can be at least twice an average or maximum width of the tether.

According to some embodiments, the tether comprises a tether connection portion having a tether connection portion centerline that physically connects the device portion to the substrate portion and the tether connection portion has a tether connection portion centerline connected to the tether device portion centerline and to the tether substrate portion centerline. The tether connection portion centerline can be orthogonal to at least one of the tether device portion centerline and the tether substrate portion centerline, wherein the tether connection portion centerline forms an oblique angle with respect to the centerline of the tether device portion, or wherein the tether connection portion centerline forms an oblique angle with respect to the centerline of the tether device portion.

According to some embodiments, the tether divides into branches. Ones of the branches can be attached to the device or to the substrate, or both. Each branch can be longer (or shorter) than an undivided tether portion of the tether. The lengths of the branches can be identical or non-identical.

According to some embodiments, the tether is a first tether and the suspended device structure comprises a second tether that physically connects the device to the substrate. The second tether can be disposed on a side of the device directly opposite the device from the first tether. The second tether can be a mirror reflection of the first tether. The second tether can have a rotated orientation with respect of the first tether. According to some embodiments, a size and shape of the second tether is substantially identical to a size and shape of the first tether.

According to some embodiments, the tether extends from a wall of the cavity. According to some embodiments, the tether extends from a structure disposed on a surface of the substrate.

According to some embodiments, the substrate comprises an anisotropically etchable material. The substrate can be a monocrystalline silicon or a compound semiconductor. In some embodiments, the monocrystalline silicon has a (100) orientation. In some embodiments, the monocrystalline silicon has a (111) orientation. The device can be native to the substrate. The device can be disposed completely in the cavity, at least partially in the cavity, or the device can be disposed above the cavity.

According to some embodiments, the tether is X-shaped, V-shaped, Y-shaped, S-shaped, double Y-shaped, acute Z-shaped, obtuse Z-shaped, right Z-shaped. In some embodiments, wherein (i) a vertex of the tether is disposed near an edge of the device (e.g., and is not a vertex of a right angle) or (ii) the centerline comprises at least one tether branch junction, the centerline does not comprise any right angle at each of the at least one tether branch junction.

According to some embodiments, the tether comprises an electrically conductive material in electrical contact with the device or an electrical conductor is disposed on a surface of the tether and electrically connected to the device. In some embodiments, the device comprises an acoustic resonator (e.g., a surface acoustic wave resonator, a bulk acoustic wave resonator, a film bulk acoustic wave resonator, or a thin-film bulk acoustic wave resonator). In some embodiments, the device is an acoustic wave filter (e.g., a bulk or surface acoustic wave filter). In some embodiments, the device is a piezoelectric sensor. In some embodiments, the device is an integrated circuit, an application-specific integrated circuit (ASIC), or an optoelectronic device that emits or receives light.

According to some embodiments, a suspended device structure comprises: a substrate; a cavity disposed in a surface of the substrate; and a device suspended entirely over a bottom of the cavity, the device comprising a device material and one or more electrodes disposed on one or more sides of the device material, wherein the device is suspended at least by a tether that physically connects the device to the substrate. The tether has a non-linear centerline, and:
  (i) the one or more electrodes are in contact with at least 10% of at least one side of the device material,
  (ii) the device comprises a piezoelectric material,
  (iii) a long dimension of the device is aligned with a normal direction of fast etch planes of the substrate,
  (iv) the device comprises piezoelectric material,
  (v) the tether is X-shaped, V-shaped, Y-shaped, S-shaped, double Y-shaped, acute Z-shaped, obtuse Z-shaped, or right Z-shaped,
  (vi) the tether has a branched centerline,
  (vii) a separation between a first tether portion and a second tether portion of the tether in a direction orthogonal to at least one of the first tether portion and the second tether portion is greater than or equal to a width of the tether,
  (viii) or any combination thereof.

According to some embodiments, a method of making a suspended device structure comprises: forming a device on a substrate entirely over a sacrificial portion of the substrate; forming a tether having a non-linear centerline physically connecting the device to the substrate in a tether direction; and etching the sacrificial portion of the substrate without etching the device or the tether to form a cavity disposed in a surface of the substrate and to suspend the device entirely over a bottom of the cavity, and:
  (i) the one or more electrodes are in contact with at least 10% of at least one side of the device material,
  (ii) the device comprises a piezoelectric material,
  (iii) a long dimension of the device is aligned with a normal direction of fast etch planes of the substrate,
  (iv) the device comprises piezoelectric material,
  (v) the tether is X-shaped, V-shaped, Y-shaped, S-shaped, double Y-shaped, acute Z-shaped, obtuse Z-shaped, or right Z-shaped, (vi) the tether has a branched centerline,
(vii) a separation between a first tether portion and a second tether portion of the tether in a direction orthogonal to at least one of the first tether portion and the second tether portion is greater than or equal to a width of the tether,
(viii) or any combination thereof.

According to some embodiments, forming the tether comprises one or both of: forming a layer on the substrate and patterning the layer and pattern-wise depositing material. In some embodiments, forming the device comprises printing an unpackaged bare die component on an intermediate substrate disposed on the substrate.

Structures and methods described herein enable a piezoelectric resonator with improved performance, construction processes, and materials.

The present disclosure provides, inter alia, methods and structures for releasing a tethered micro-transfer-printable device from a source wafer faster, more efficiently, and more effectively. According to some embodiments of the present disclosure, a device structure comprises a substrate (e.g., a source wafer or a native source wafer on which the device is formed) and a patterned sacrificial layer defining or comprising a sacrificial material disposed on or in the substrate. The sacrificial layer can be a portion of the substrate. The patterned sacrificial layer defines sacrificial portions laterally spaced apart by anchors. Each sacrificial portion can be at least partially exposed. A device (component) can be disposed entirely over each sacrificial portion and can be connected to at least one anchor by a tether. The tether comprises or has a hole or tether opening that extends through the tether to the sacrificial portion. According to some embodiments, the patterned sacrificial layer comprises a semiconductor material, the sacrificial portion comprises a semiconductor material, or both. The semiconductor material can be silicon or a compound semiconductor and can be the same material as the sacrificial material, or different. The semiconductor material can be crystalline silicon having a crystal structure of {100}.

According to embodiments of the present disclosure, a device structure comprises a substrate having a sacrificial layer comprising a sacrificial portion adjacent to an anchor portion, a device disposed completely over the sacrificial portion, a tether that physically connects the device to the anchor portion, and a tether opening disposed in the tether that extends through the tether to the sacrificial portion. The tether opening can be in contact with the anchor portion or extend into the anchor portion, can be in contact with the device, can be in contact with both the anchor portion and the device, or can extend into the anchor portion and be in contact with the device. The tether opening can have a T-shape comprising an opening cross bar and an opening upright, and the opening cross bar can be in contact with the anchor portion or extend into the anchor portion. The tether opening can have a T-shape comprising an opening cross bar and an opening upright, and the opening upright can be in contact with the device.

According to some embodiments of the present disclosure, the device can have a first edge having a device length and a second edge having a device width, the device length can be longer than the device width, and the tether connects to the first edge. The device width can be no greater than one half of the device length. The tether can have a tether length and the tether length can be at least one third of the device length.

In some embodiments, the substrate comprises silicon 1 0 0.

According to some embodiments, device has a device bottom adjacent to the substrate and the device bottom is bent, curved, curled, or warped.

In some embodiments, at least a part of the sacrificial portion is a cavity, recess, or gap.

According to some embodiments of the present disclosure, a device structure comprises a substrate, a device disposed completely over a recess in the substrate, and a tether that physically connects the device to an anchor portion disposed on the substrate such that the device is suspended over the recess by the tether. The tether can have a tether opening that extends through the tether to the sacrificial portion.

According to embodiments of the present disclosure, a device structure comprises a substrate having a sacrificial layer comprising or defining a sacrificial portion adjacent to an anchor portion, a device disposed completely over the sacrificial portion, and a tether that physically connects the device to the anchor portion. The tether can have a T-shape comprising a tether crossbar and tether upright with the tether cross bar attached to the anchor portion. A tether opening can be disposed in the tether that extends through the tether. The tether cross bar can be in contact with the anchor portion. The tether upright ca be in contact with the device. The substrate can comprise silicon 1 0 0. The device can have a device bottom adjacent to the substrate and the device bottom can be bent, curved, curled, or warped. At least a part of the sacrificial portion can be a cavity, recess, or gap. The device can have device length and a device width and the device width can be no greater than one half of the device length. The tether can have a tether length and the tether length can be at least one third of the device length.

According to some embodiments of the present disclosure, a device structure comprises a substrate, a device disposed completely over a recess in or on the substrate, and a tether that physically connects the device to an anchor portion disposed on the substrate such that the device is suspended over the recess by the tether. The tether can have a T-shape comprising a tether crossbar and tether upright with the tether cross bar attached to or extending into the anchor portion.

According to embodiments of the present disclosure, a device structure, comprises a substrate having a sacrificial layer defining or comprising a sacrificial portion adjacent to an anchor portion, a device disposed completely over the sacrificial portion, wherein the device has a device length and the device length extends along a device edge to a device end, a first tether that physically connects the device to the anchor portion, and a second tether that physically connects the device to the anchor portion. The first tether can be closer to the second tether than to the device end and the second tether can be closer to the first tether than to the device end. The device can have a device width, and the device length can be longer than the device width. The device can have a device edge and a device end on the device edge, the device having a device length taken along the device edge. According to some embodiments, the device has a second device edge side having a device width, the device length is longer than the device width, and the first tether and the second tether are connected to the device along the device edge. The device width can be no greater than one half of the device length. The tether can have a tether length and the tether length can be at least one third of the device length. The substrate can comprise silicon 1 0 0. The device can have a device bottom adjacent to the substrate and the device bottom can be bent, curved, curled, or warped. At least a part of the sacrificial portion can be a cavity, recess, or gap.

According to some embodiments, a device structure comprises a substrate, a device disposed completely over a recess in or on the substrate, wherein the device has a device edge and a device end on the device edge, the device having a device length taken along the device edge, a first tether that physically connects the device to an anchor portion disposed on the substrate, and a second tether that physically connects the device to the anchor portion. The first tether and the second tether can suspend the device over the recess and the first tether can be closer to the second tether than to the device end and the second tether can be closer to the first tether than to the device end.

According to embodiments of the present disclosure, a device structure comprises a substrate having a sacrificial layer defining or comprising a sacrificial portion adjacent to an anchor portion, a device disposed completely over the sacrificial portion, a first tether that physically connects the device to the anchor portion, and a second tether that physically connects the device to the anchor portion. The first tether can be spatially separated from the second tether by a distance that can be no greater than a combined length of the first tether and the second tether. The device can have a first device edge having a device length and a second device edge having a device width, the device length is longer than the device width, and the first tether and the second tether are connected to the device along the first device edge. The device can have a device length and a device width, and the device length can be longer than the device width. The device width can be no greater than one half of the device length. The first tether can be closer to second tether than to an end of device 20. The substrate comprises silicon 1 0 0. The device can have a device bottom adjacent to the substrate and the device bottom can be bent, curved, curled, or warped. At least a part of the sacrificial portion can be a cavity, recess, or gap.

According to embodiments of the present disclosure, a device structure comprises a substrate, a device disposed completely over a recess in or on the substrate, a first tether that physically connects the device to an anchor portion disposed on the substrate, and a second tether that physically connects the device to the anchor portion. According to some embodiments, the first tether is spatially separated from the second tether by a distance that is no greater than a combined length of the first tether and the second tether.

According to some embodiments, the etchant material that etches the sacrificial portion is tri-methyl ammonium hydroxide (TMAH) or potassium hydroxide (KOH).

According to some embodiments of the present disclosure, (i) the device is encapsulated with an encapsulating material, (ii) the anchor is encapsulated with or comprises an encapsulating layer, or (iii) both (i) and (ii). The tether can comprise the encapsulating material or the encapsulating material can form the tether. The encapsulating material can be at least partially in direct contact with the sacrificial portion.

According to some embodiments of the present disclosure, a method of making a device structure comprises the step of providing a substrate, e.g., a native source wafer. The substrate can comprise a patterned sacrificial layer or a patterned sacrificial layer can be disposed on the substrate. The patterned sacrificial layer can comprise a sacrificial material disposed on or in the substrate. The patterned sacrificial layer can comprise sacrificial portions laterally spaced apart by anchors. Devices are disposed entirely over each sacrificial portion and connected to at least one anchor by a tether. The tether comprises a hole or tether opening that extends through the tether to the sacrificial portion. The tether opening can be made in the same patterning process that defines the tether, for example a photolithographic process. The sacrificial portion is etched, for example anisotropically etched to release the device from the substrate so that the device is physically connected by the tether to the anchor portion.

Structures and methods described herein enable an efficient, effective, and fast release of a micro-transfer printable device or component from a substrate (e.g., a native source wafer on or in which the device is disposed or formed).

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 28A is a perspective of a wedge useful in understanding illustrative embodiments of the present disclosure, FIG. 28B shows the perspective of FIG. 28A with orthogonal cross section lines A and B, FIG. 28C is a cross section of FIG. 28B taken across cross section line A, and FIG. 28D is a cross section of FIG. 28B taken along cross section line B; and FIG. 29 is a micrograph of a wedge useful in understanding illustrative embodiments of the present disclosure.

Figure 1A:
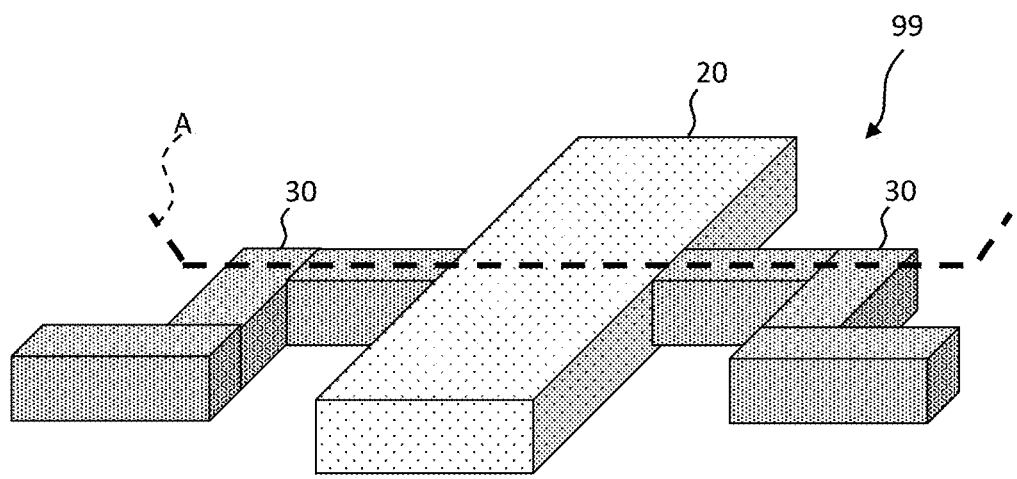
FIG. 1A is a perspective of a suspended device structure, according to illustrative embodiments of the present disclosure.
Figure 1B:
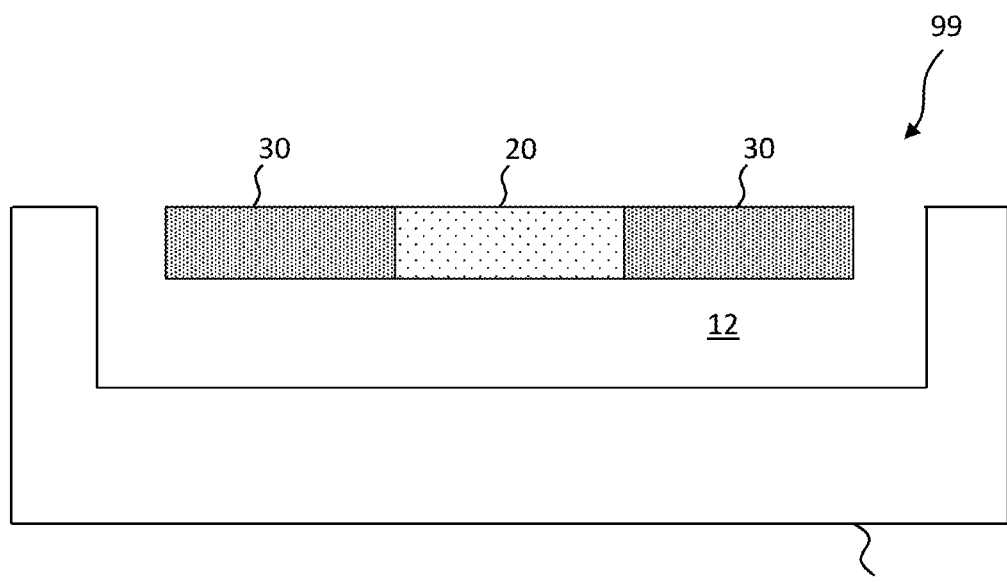
FIG. 1B is a cross-section and enlargement corresponding to cross section line A of FIG. 1A.
Figure 1C:
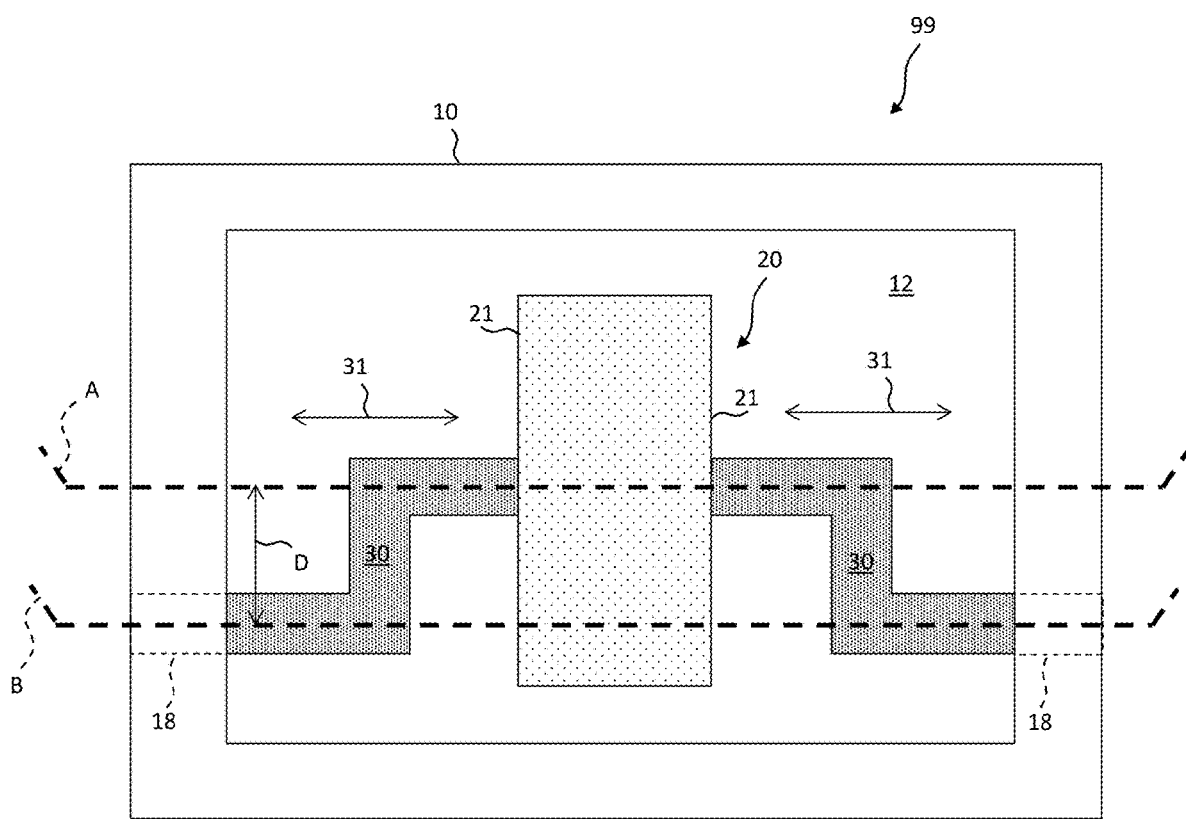
FIG. 1C is a plan view of FIGS. 1A and 1B indicating cross section line A.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, a structure and method for constructing piezoelectric acoustic resonator micro-devices. Such piezoelectric micro-devices convert electrical energy provided by electrodes disposed on the micro-device into mechanical energy. The micro-device is sized and shaped to resonate at a desired frequency. Mechanical vibration at the desired resonant frequency is converted to electrical energy by the piezoelectric material to provide a filtered electrical signal.

Piezoelectric acoustic resonators have been demonstrated in a variety of types, for example with surface acoustic waves in, for example, a surface acoustic wave (SAW) filter, in a bulk acoustic wave (BAW) filter, a film bulk acoustic resonator (FBAR), or a thin-film bulk acoustic resonator (TFBAR). Such resonators are fixed to a substrate and can incorporate acoustic reflectors or acoustic mirrors that inhibit the dissipation of mechanical energy into the substrate and promote resonance at the desired frequency. Other piezoelectric acoustic resonators are suspended over a cavity in a substrate by straight tethers physically connecting the resonator to the substrate in a straight line. The resonator is therefore free to vibrate independently of the substrate, except for any confounding effects from the tethers, thereby reducing mechanical energy losses and providing a greater device efficiency.

Suspended piezoelectric acoustic resonators can be constructed by patterning a bottom electrode on a substrate, disposing and (e.g., patterning) piezoelectric material over the bottom electrode, and then patterning a top electrode over the piezoelectric material to form an acoustic resonator. In some embodiments, the bottom electrode, the device and the top electrode materials are first deposited and then separately patterned or patterned together in a common step. The substrate material beneath the bottom electrode is etched, for example with a dry etch such as $XeF_2$, to form the cavity and suspend the piezoelectric acoustic resonator over the cavity. In some processes, the cavity etch can be initiated via wet etch, for example when exposed to a hot bath of tetramethylammonium hydroxide (TMAH) or potassium hydroxide (KOH), and finalized with the dry $XeF_2$ etch. The top and bottom electrodes and piezoelectric material are patterned to form tethers that connect the main body of the piezoelectric acoustic resonator to the substrate. Wet etching processes can form bubbles that mechanically stress the resonator or tethers and possibly damage them.

Furthermore, the present disclosure recognizes that a dry etch material such as $XeF_2$ can be difficult to use and problematic in and with some device substrate materials and structures. For example, $XeF_2$ can be incompatible with metals, such as gold, that are useful for electrodes used in piezo-electric devices. Furthermore, $XeF_2$ etching can cause physical stress to the tethers and/or devices, possibly damaging or destroying them. The etch can be a pulsed etch repeated every two seconds in which a gas is repeatedly introduced into a processing chamber, a plasma is discharged, and the gas is vented, exposing the resonator to repeated high and low vacuum pressures that can mechanically stress the resonator. Moreover, vacuum chamber valve operation can cause vibrations. These various mechanical stresses can cause the resonator and its supporting wafer to vibrate and form cracks in the piezoelectric materials, electrodes, or tethers or even detach the resonator from the substrate during etching, thereby significantly impairing final device performance or rendering the final device non-functional.

In order to mitigate such undesired outcomes, the resonator and tethers can be fully encapsulated and undergo multiple chemical baths to remove any potential contaminants or any organic residues at the surface. After etching to release the resonator from the substrate (so that there is no direct physical attachment between the device and the substrate), encapsulation materials can be removed to avoid interfering with the acoustic response of the resonator. These additional operations add expense to a manufacturing process and can themselves crack or break suspended devices or tethers, for example with capillary forces. There is a need therefore for alternative methods and structures for making a suspended micro-device.

The present disclosure provides, inter alia, suspended device structures having non-linear tethers and methods of their formation. By using non-linear tethers, the final devices can be released from an underlying substrate and suspended over a cavity, for example using wet etchants such as TMAH or KOH rather than a dry etchant such as $XeF_2$, can have improved mechanical isolation, and damage thereto incurred during etching is reduced or eliminated. As described in further detail below, non-linear tethers can have, for example, right, obtuse, or acute Z-shaped tethers (e.g., tethers with right or oblique angles), X-shaped tethers, V-shaped tethers, Y-shaped tethers or double Y-shaped tethers (having orthogonal segments or non-orthogonal segments), or serpentine tethers. A non-linear tether can comprise linear tether segments with centerlines that that are non-collinear (e.g., not collinear or not formed in a common line).

Figure 1D:
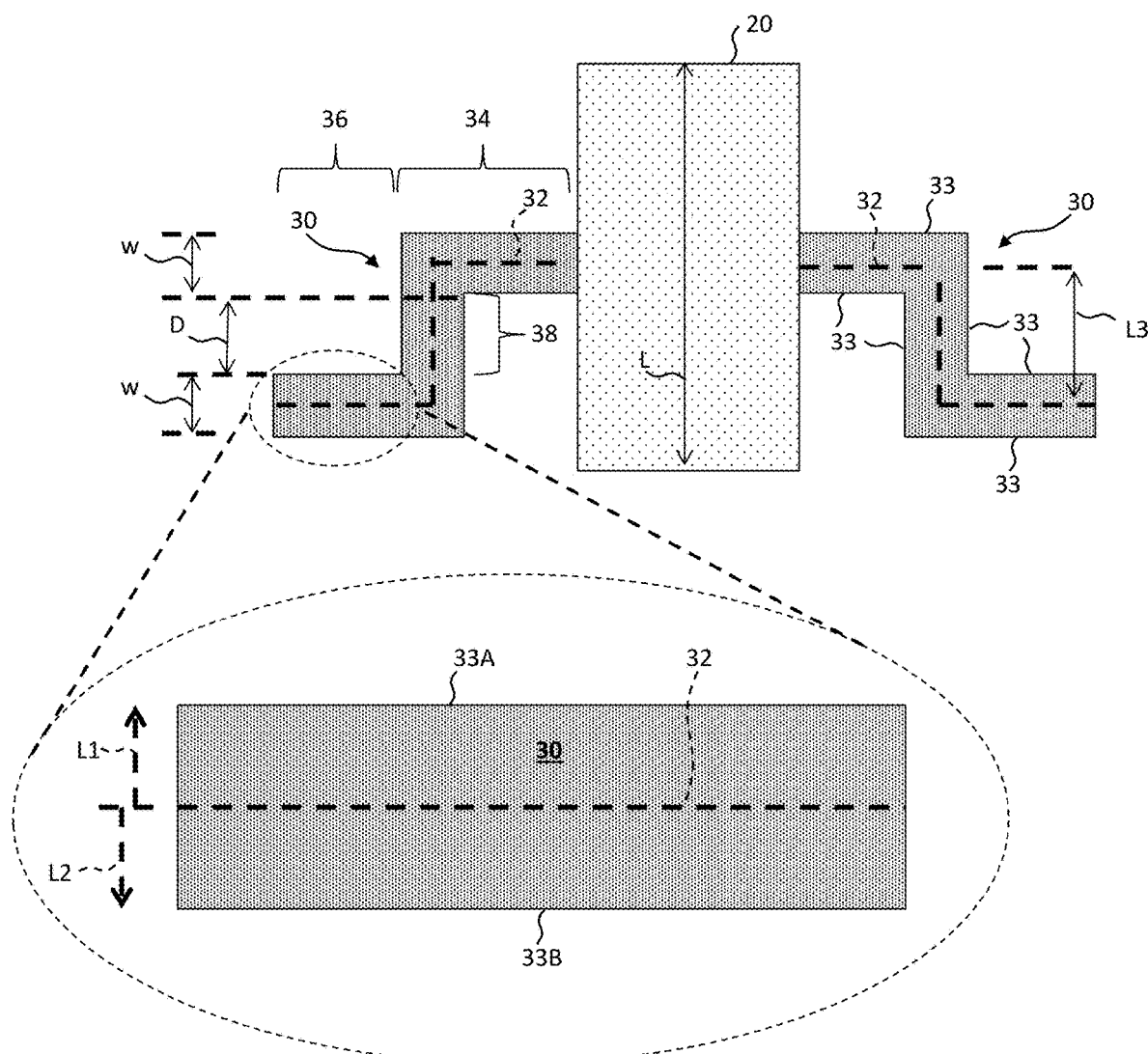
FIG. 1D is a plan view corresponding to FIGS. 1A, 1B, 1C and indicating tether and device centerlines.
Figure 21:
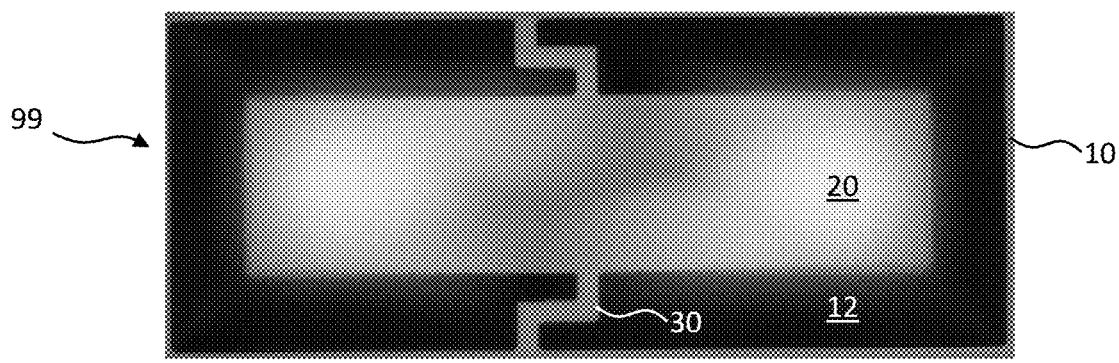
Figure 22:
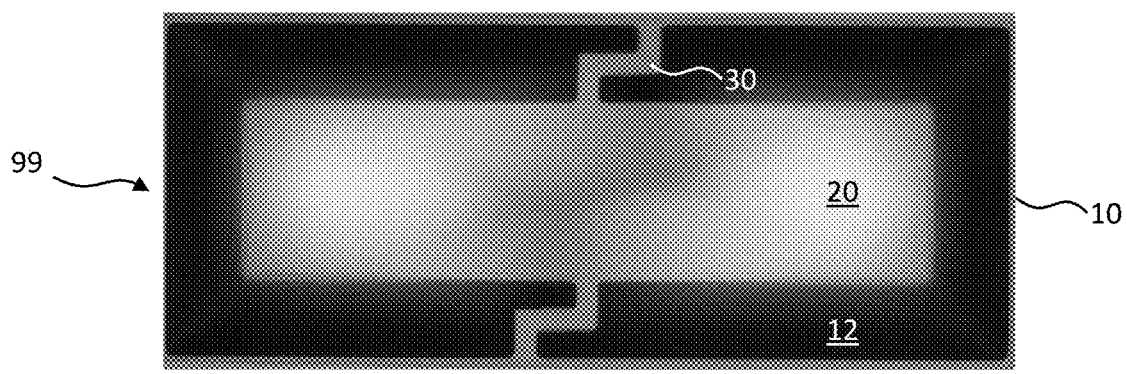

According to illustrative embodiments of the present disclosure and as illustrated in the perspective and corresponding cross section, plan view, and detail view of FIGS. 1A-1D (collectively FIG. 1) and micrograph of FIG. 21, a suspended device structure 99 comprises a substrate 10, a cavity 12 disposed in the substrate 10, and a device 20 suspended entirely over a bottom of cavity 12 at least by a tether 30 that physically connects device 20 to substrate 10 in a tether direction 31 so that tether 30 extends from an edge of device 20. (In FIG. 1, tethers 30 are made of continuous material, for example formed in a single photolithographic deposition.) Tether 30 has a centerline 32 that comprises non-collinear points (e.g., non-collinear portions) and is therefore a non-linear centerline 32. According to some embodiments of the present disclosure and as illustrated in FIG. 1D, tether 30 has a first tether portion (e.g., tether device portion 34) separated from a second tether portion (e.g., tether substrate portion 36) in a direction orthogonal to tether direction 31, for example so that the first and second portions are not in direct contact. The separation can be a distance D that is at least a width W of any portion of tether 30 so that distance D is equal to or greater than width W. Width W can be a width measured at a cross section of tether 30. In some embodiments, distance D is no less than an average width, a minimum width, or a maximum width of tether 30. Distance D can be measured in a direction parallel to a device edge 21 from which tether 30 extends. In some embodiments, "a direction parallel to edge of device 21" can refer to a direction parallel to a tangent of an edge of device 21, for example when device 20 has a curved edge 21, or a direction orthogonal to an angular bisector of a vertex formed by two edges of device 21, for example when tether 30 extends from a vertex of a device 20 with a polygonal perimeter. Device 20 can have a length L that is a longest dimension of device 20 orthogonal to tether direction 31 (e.g., parallel to device edge 21). In some embodiments, the respective centerlines 32 of the first and second tether portions are separated by at least a distance L3 that is at least twice a width of any portion of tether 30 in a direction. The direction can be orthogonal to at least one of the centerline of the first portion and the centerline of the second portion, orthogonal to tether direction 31, or parallel to device edge 21. The width can be, for example, a maximum width, an average width, or a minimum width.

Device 20 can be or can include any one or more of a piezoelectric device, a micro-device, an integrated circuit, an electromechanical filter, an acoustic resonator, or a power source that harvests vibrations to provide electrical power but is not limited to any of these devices. Device 20 can be native to substrate 10, or non-native to substrate 10. A piezoelectric device is a device that comprises electrodes and piezoelectric material that converts electrical signals provided by the electrodes to mechanical energy, converts mechanical energy to electrical signals provided on the electrodes, or converts electrical signals to mechanical energy and mechanical energy to electrical signals through electrodes (e.g., converts electrical signals to mechanical energy and then back to electrical signals that are possibly modified or filtered). Electrodes can be disposed on one side of device 20 (e.g., a top side opposite substrate 10) or on opposing top and bottom sides of device 20. Electrodes can be solid or interdigitated on one side or both sides of device 20 and can cover and be in contact with at least 10% (e.g., at least 20%, 40%, 50%, 60%, 80%) of the piezoelectric material. If electrodes cover too small of an area on the piezoelectric material, a conversion of electrical energy in the electrodes to mechanical energy in the piezoelectric material can be inefficient and inadequate. According to some embodiments of the present disclosure, the electrodes cover and are in contact with at least 10% of the piezoelectric material area.

Figure 2A:
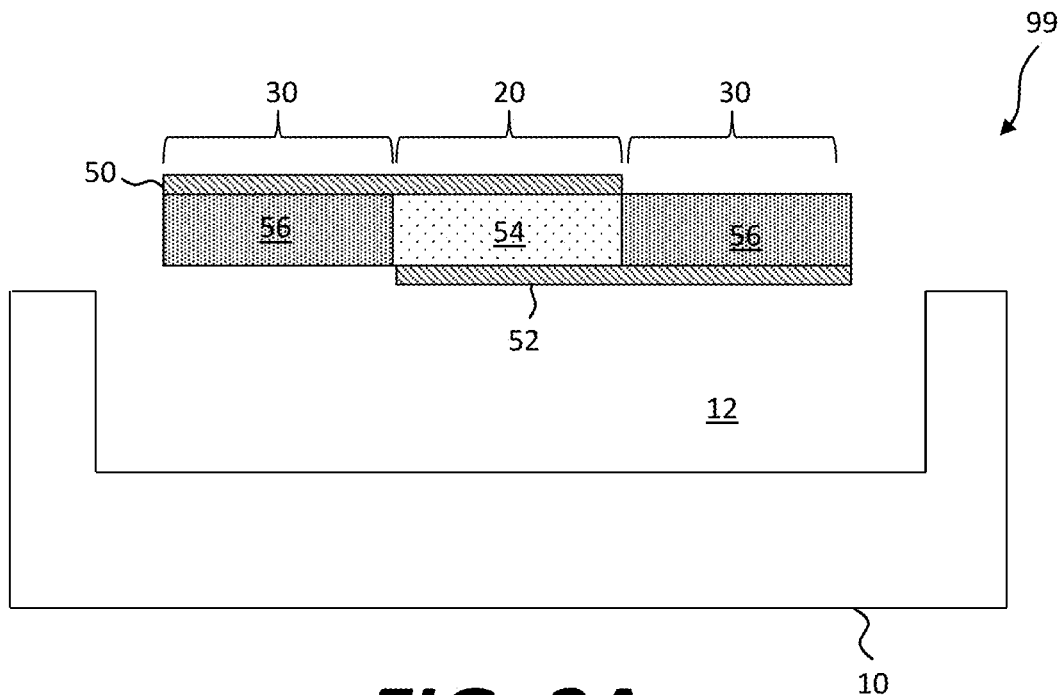
FIG. 2A is a cross section of a device structure with electrodes according to illustrative embodiments of the present disclosure.
Figure 2B:
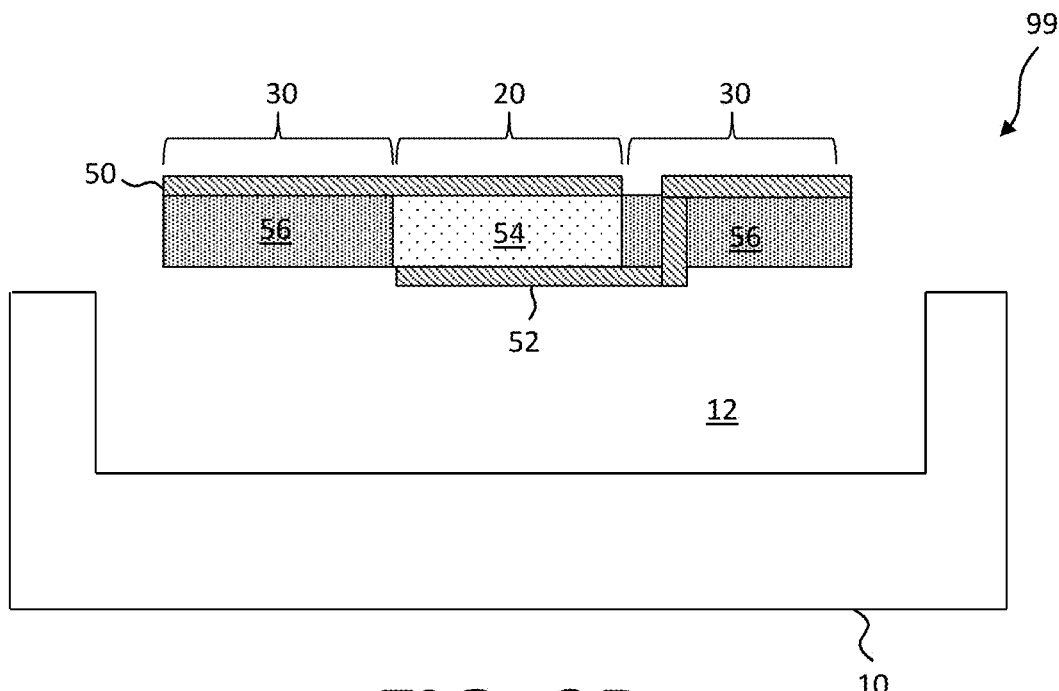
FIG. 2B is a cross section of a device structure with electrodes and a via according to illustrative embodiments of the present disclosure.
Figure 2C:
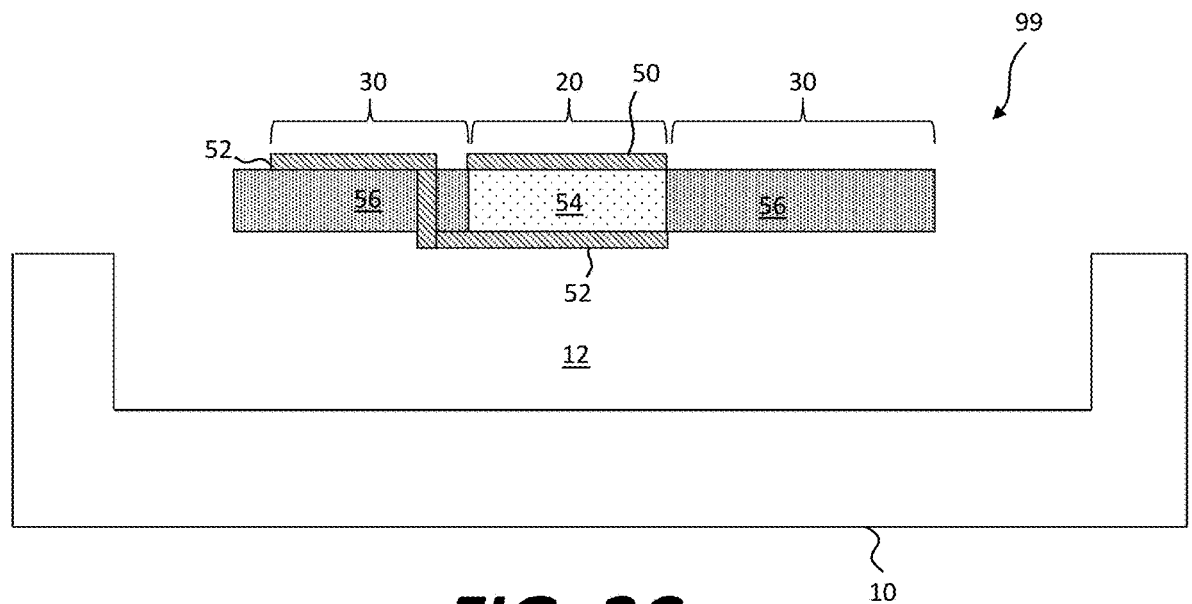
FIG. 2C is a cross section of a device structure with electrodes and a via according to illustrative embodiments of the present disclosure taken along cross section line A of FIG. 2D.
Figure 2D:
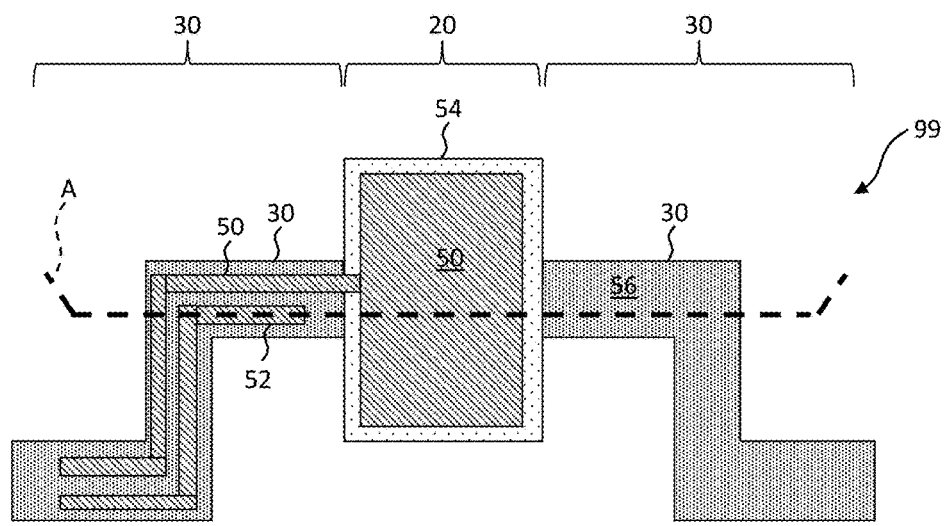
FIG. 2D is a plan view of a device structure with electrodes and a via according to illustrative embodiments of the present disclosure.

A micro-device is any device that has at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and a thickness of from 200 nm to 200 microns (e.g., at least or no more than 2 microns, 20 microns, or 200 microns). Device 20 can have any suitable aspect ratio or size in any dimension and any useful shape, for example a rectangular cross section or top or bottom surface. Device 20 can be an electromechanical filter that filters electrical signals through mechanically resonant vibrations, for example an acoustic resonator or a power source that responds to mechanical vibrations with electrical power. As shown in the cross section of FIGS. 2A and 2B taken along cross section line A of a structure generally in accordance with FIG. 1C, device 20 of suspended device structure 99 can comprise a layer of piezoelectric material 54, for example, but not limited to, aluminum nitride (AlN) or potassium sodium niobate (KNN), with a top electrode 50 on a top side of the piezoelectric material 54 and a bottom electrode 52 on a bottom side of the piezoelectric material 54 opposite the top side. Top and bottom electrodes 50, 52 are collectively electrodes. Top electrode 50 or bottom electrode 52, or both, can extend along a surface of tether 30 (e.g., a top surface and a bottom surface thereof, respectively) as shown in FIG. 2A. As shown in FIG. 2B, bottom electrode 52 can pass through a via and extend over a top side of tether 56. As shown in the cross section of FIG. 2C and plan view of FIG. 2D, bottom electrode 52 can pass through a via and extend over a top side of the same tether 56 on which the top electrode 50 is disposed. Generally, various electrode configurations are possible, such as, for example, those typically found in SAW resonators, BAW resonators, FBARs, or TFBARs and are expressly contemplated as embodiments of the present disclosure. In some embodiments, device 20 is an acoustic wave filter, such as a SAW filter, a BAW filter, an FBAR filter, or a TFBAR filter. In some embodiments, device 20 is a piezoelectric sensor.

Tethers 30 can comprise any suitable tether material 56 and can incorporate one or more layers, for example one or more layers similar to or the same as those layer(s) of device 20, for example comprising electrode materials and/or piezoelectric materials 54, for example as shown in FIG. 2A, or comprising dielectric materials. Top and bottom electrodes 50, 52 can extend over or be a part of tethers 30 to electrically connect device 20 to external devices or electrical connections. Electrodes can comprise a patterned layer of metal, or layer(s) of metal, for example titanium and/or gold in, for example, thicknesses from 100 nm to 1 micron. Other materials, such as dielectrics, for example silicon dioxide or silicon nitride, can be used in tethers 30. Substrate 10 can be any useful substrate in which cavity 12 can be formed, for example as found in the integrated circuit or display industries. Substrate 10 can be chosen, for example, based on desirable growth characteristics (e.g., lattice constant, crystal structure, or crystallographic orientation) for growing one or more materials thereon. In some embodiments of the present disclosure, substrate 10 is an anisotropically etchable. For example, substrate 10 can be a monocrystalline silicon substrate with a (100) or (111) orientation. An anisotropically etchable material etches at different rates in different crystallographic directions, due to reactivities of different crystallographic planes to a given etchant. In particular, silicon (100) is a readily available, relatively lower cost monocrystalline silicon material for which non-linear tethers 30 of the present disclosure enable etching and releasing device 20 from substrate 10. For example, potassium hydroxide (KOH) displays an etch rate selectivity 400 times higher in silicon [100] crystal directions than in silicon [111] directions. In the particular case of silicon (100), use of a non-linear tether 30 (as opposed to a linear tether) can ensure complete release of device 20 and tether 30 when substrate 10 is etched, for example using KOH, in order to suspend device 20 with tether 30. Generally, monocrystalline substrates 10 having other orientations (such as a (111) orientation) are less prone to incomplete release of device 20 and a tether when using a linear tether. Moreover, devices 20 made on or in a silicon (100) crystal structure can have less stress and therefore less device bowing after release.

According to some embodiments of the present disclosure, tethers 30 have a non-linear (e.g., non-collinear) centerline 32 (including non-collinear points). A centerline 32 is a set of points that bisect tether 30 in a plane that is substantially parallel to a surface of substrate 10. Centerline 32 extends along a length of tether 30. A length of tether 30 can be longer than a width W of tether 30. Centerline 32 can divide tether 30 into two halves, for example halves that are geometrically congruent or similar, that can completely overlie each other, or that are reflections or rotations of each other. Centerline 32 can comprise points midway between tether edges 33 of tether 30, for example at the midpoint of a straight line segment that intersects opposite tether edges 33 of tether 30, for example tether edges 33A and 33B as shown in FIG. 1D. Opposite tether edges 33 can be the closest edge of tether 30 on an opposite side of centerline 32. For example, as shown in FIG. 1D, centerline 32 is a distance L1 from first tether edge 33A and a distance L2 from second tether edge 33B in a direction orthogonal to centerline 32, and L1 is equal to L2. Centerline 32 can be continuous or discontinuous. For example, if tether 30 has a portion with an asymmetric cross section adjacent to a portion with a symmetric cross section can have a discontinuous centerline 32. At a discontinuous point of centerline 32, no orthogonal direction can be defined. A non-linear centerline 32 is a centerline comprising points that are not all in a common straight line substantially in a common plane (i.e., comprising non-collinear points). As used herein, centerlines 32, device edges 21, widths W of tether 30, and separation distances D are drawn or measured in a plane parallel to a surface of substrate 10 (e.g., a bottom of cavity 12 in substrate 10). Non-linear (e.g., serpentine) tethers 30 can have different structures or arrangements, as shown in FIGS. 5-11 and 18-22.

Figure 3:
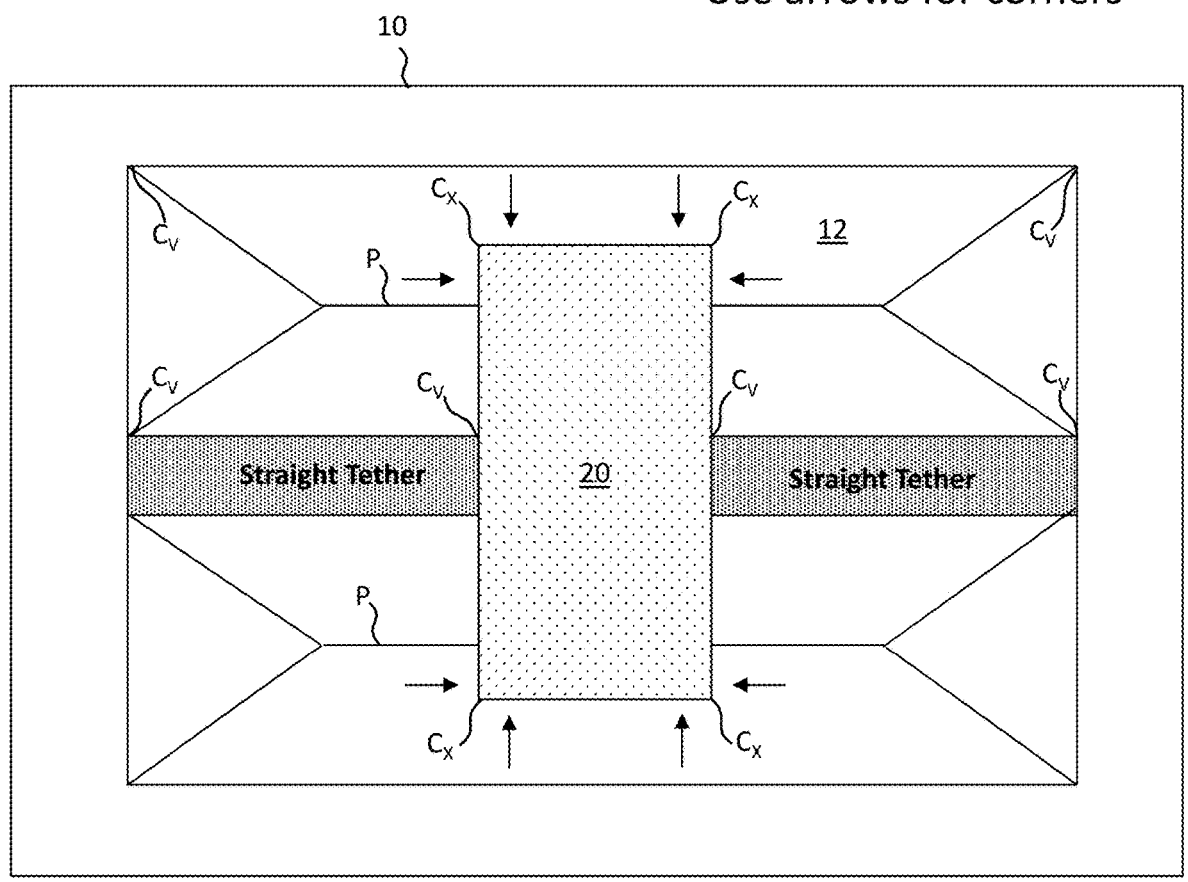
FIG. 3 is a plan view of an etched device with a straight tether useful in understanding embodiments of the present disclosure.

Tethers 30 with a centerline 32 comprising non-collinear points provide advantages in etching cavity 12 to release device 20 from substrate 10, where substrate 10 comprises an anisotropically etchable material (such as monocrystalline silicon (100) and (111)). As illustrated in FIG. 3, with such substrates, etching under a conventional straight tether on directly opposite sides of a device 20 properly oriented with respect to the crystal structure will not release device 20 from underlying substrate 10 if the straight tether extends in a direction orthogonal to device 20, as is commonly done. Without wishing to be bound to any particular theory, an etchant applied to the crystal surface will form an inverted pyramid P in a crystalline substrate 10 and will stop etching when it reaches a crystal etch stop plane defined by the crystal structure. Where convex corners exist in the etched structure, the etchant can attack the material from two directions, in at least one of which the etch will proceed, or from a different plane in which etching will proceed. When only concave corners remain that expose crystal planes that are resistant to etching, the etch will stop when the inverted pyramid P shape is attained. Because the ends of device 20 have convex corners Cx, the etch can proceed to release the ends but when the etchant reaches the straight tethers only concave corners Cv exposing crystal planes resistant to etching remain, so the etch stops and the straight tether and the portion of device 20 in a line with the straight tethers will not be released, as shown in FIG. 3. (A released device 20 is physically connected to substrate 10 only by tethers 30 and is not otherwise directly connected to substrate 10. A released tether 30 is physically connected only to device 20 and only to substrate 10 at or on an edge of cavity 12 (e.g., at an anchor portion 18). After a desired complete release, there is no physical attachment from the bottom of device 20 or tether 30 to substrate 10.)

Figure 4:
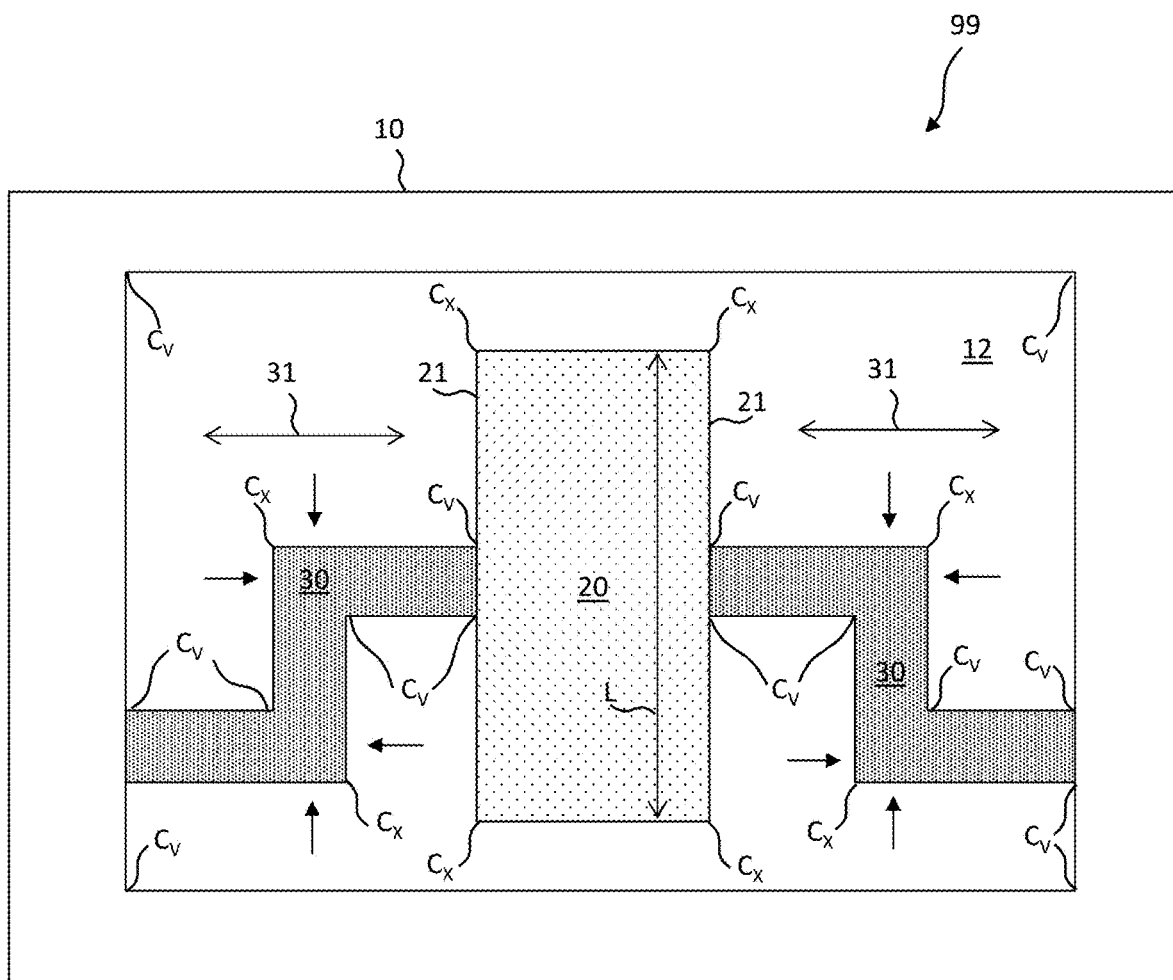
FIG. 4 is a plan view of a device with a non-linear tether useful in understanding embodiments of the present disclosure.

In contrast and according to some embodiments of the present disclosure as illustrated in FIG. 4, a non-linear tether 30 having a non-linear centerline 32 has convex corners Cx in non-linear tether 30 as well as device 20 that are accessible for etching, for example when constructed on, in, or over an anisotropically etchable monocrystalline substrate, e.g., a silicon (100) or silicon (111) substrate 10. However, because the etch fronts will cease to advance once a concave corner Cv is met, it is preferred that the portions of tether 30 that extend in the same direction are separated in a direction orthogonal to the direction in which the portions of tether 30 extends, for example by a distance D greater than or equal to a width W of tether 30 (and the respective centerlines 32 can be separated by a distance L3 greater than or equal to twice a width W of tether 30, for example in a direction orthogonal to at least one of the portions, in a direction orthogonal to tether direction 31 or parallel to device edge 21). Because the crystalline etch planes of the crystalline substrate 10 are angled (not orthogonal to a surface of substrate 10, for example about 54.7 degrees), to ensure a complete release of device 20 from substrate 10 device and substrate tether portions 34, 36 are separated, for example by a distance D equal to or greater than a width of tether 30. Tetramethylammonium hydroxide (TMAH) or potassium hydroxide (KOH) can be used to anisotropically etch monocrystalline silicon (100) or (111) and such materials are contemplated for use in structures and methods of the present disclosure.

Certain embodiments of the present disclosure provide a structure, materials, and method for a suspended device structure 99 comprising a device 20 suspended over a cavity 12 in a substrate 10 by non-linear tethers 30. Substrate 10 can be an anisotropically etchable material such as silicon (100). Device 20 is released from substrate 10 with an etchant, leaving device 20 suspended over cavity 12 is substrate 10 by non-linear tethers 30. Such a structure has the advantage of using etching materials and process that are less stressful to devices 20 and tethers 30, improving manufacturing yields. Moreover, the present disclosure recognizes that a source of parasitic resonance modes in device 20, when a piezo-electric device, can result specifically from straight tethers used to connect device 20 to substrate 10 over bottom of cavity 12. Non-linear tethers 30 of the present disclosure can have improved performance by reducing the number or magnitude of parasitic resonance modes in device 20, where device 20 comprises piezoelectric materials 54. Furthermore, using anisotropically etchable substrate 10 material in substrate 10 can reduce contamination during etching, such as particles, as compared to using isotropically etchable materials such as oxides that are etched with etchants such as hydrofluoric acid or hydrochloric acid.

Figure 5:
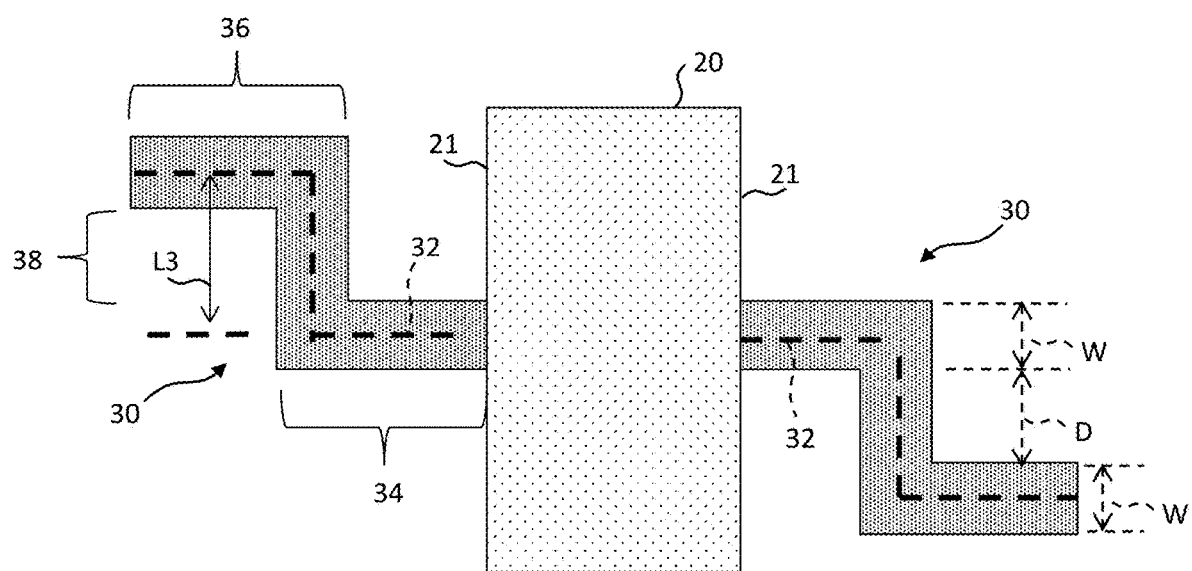
FIGS. 5-7 are plan views of suspended device structures with non-linear tethers according to illustrative embodiments of the present disclosure.

As shown in the embodiments illustrated in FIGS. 1A-1D, 4-6B, 8-11, and 19-23, centerline 32 comprises non-collinear line segments that are straight. Thus, each line segment comprises collinear points, but the line segments themselves are not collinear. For example, as shown in FIG. 5, tether 30 comprises a tether device portion 34 that attaches to device edge 21 of device 20 at an orthogonal angle, a tether substrate portion 36 that attaches to an edge of substrate 10 (not shown) at an orthogonal angle, and a tether connection portion 38 that physically connects tether device portion 34 to tether substrate portion 36, optionally at an orthogonal angle. Centerlines 32 of each of tether portions 34, 36, 38 are straight line segments. Thus, FIG. 5 illustrates an example of a right Z-shaped tether 30. Centerlines 32 of tether device portion 34 and tether substrate portion 36 can be offset, parallel, and orthogonal to device edge 21 of device 20 and/or an edge of cavity 12 (e.g., as shown in FIG. 1) and centerline 32 of tether connection portion 38 is orthogonal to the centerlines 32 of both tether device portion 34 and tether substrate portion 36, as is also the case in FIG. 1.

To facilitate device 20 release from substrate 10 and suspend device 20 over cavity 12 (e.g., as shown in FIG. 1), tether device portion 34 and tether substrate portion 36 are separated in a direction orthogonal to a tether direction, for example by a distance no less than a width W of tether device portion 34 or a width W of tether substrate portion 36, for example as shown in FIGS. 1 and 5. As shown in FIG. 5, tether device portion 34 is separated from tether substrate portion 36 by a distance D that is no less than a width W of tether device portion 34 or tether substrate portion 36. Thus, in some embodiments wherein a device centerline is orthogonal to centerlines 32 of tether device portion 34 and tether substrate portion 36, tether device portion 34 and tether substrate portion 36 are separated in a direction of the device centerline, for example by a length of tether connection portion 38 that is no less than a width W of tether device portion 34 or tether substrate portion 36.

A separation distance D of tether connection portion 38 between tether device and substrate portions 34, 36 that is greater than or equal to a width W of tether 30 can be, but is not necessarily, equivalent to a centerline 32 of a first tether portion (e.g., tether device portion 34) separated from a centerline 32 of a second tether portion (e.g., tether substrate portion 36) by a distance L3 that is at least twice a width W of tether 30 in a direction parallel to an edge of device 20 or cavity 12 since centerline 32 bisects tether 30, if the first and second tether portions have a constant width. Thus, in some embodiments, a tether device portion 34 centerline 32 and a tether substrate portion 36 centerline 32 are separated by a distance that is at least twice a width of tether 30, for example in a direction orthogonal to at least one of tether device portion 34 centerline 32 and tether substrate portion 36 centerline 32. A width W of tether 30 can be a width W of any portion of tether 30, for example a minimum, average, or maximum width W, and can be a dimension of tether 30 that is shorter than a length of tether 30 in a plane substantially parallel to a surface of substrate 10 A length of tether 30 is a length of centerline 32 of tether 30 extending from device 20 to substrate 10. By ensuring separation by a distance D between tether device portion 34 and tether substrate portion 36, etching beneath tether 30 is facilitated and can proceed quicker and release from substrate 10 is assured.

According to some embodiments of the present disclosure, a suspended device structure 99 comprises a substrate 10, a cavity 12 disposed in a surface of substrate 10, and a device 20 suspended entirely over a bottom of cavity 12, device 20 comprising a device material and one or more electrodes (e.g., top and bottom electrodes 50, 52) disposed on one or more sides of device 20. Device 20 is suspended at least by a tether 30 that physically connects device 20 to substrate 10. Tether 30 has a non-linear centerline 32, and (i) the one or more electrodes are in contact with at least 10% of at least one side of device 20, (ii) device 20 comprises a device material that is a piezoelectric material 54, or (iii) both (i) and (ii).

According to some embodiments and as illustrated in FIGS. 1, 4, a suspended device structure 99 comprises a substrate 10 comprising monocrystalline silicon having a (100) orientation, a cavity 12 disposed in a surface of substrate 10, and a device 20 suspended entirely over a bottom of cavity 12. Device 20 is suspended at least by a tether 30 that physically connects device 20 to substrate 10. Tether 30 has a non-linear centerline 32 and a length L of device 20 is oriented with respect to a crystalline structure of substrate 10 so that an etchant applied to substrate 10 will etch completely beneath device 20 to form cavity 12, for example in a fast etch direction. Length L of device 20 can be a long dimension of device 20, for example the extent of device 20 in its largest dimension. Length L of device 20 (e.g., a largest dimension of device 20) can be aligned with a normal direction of fast etch planes for substrate 10 (that is, with a normal to those planes) in order to promote complete release during etching.

Figure 6A:
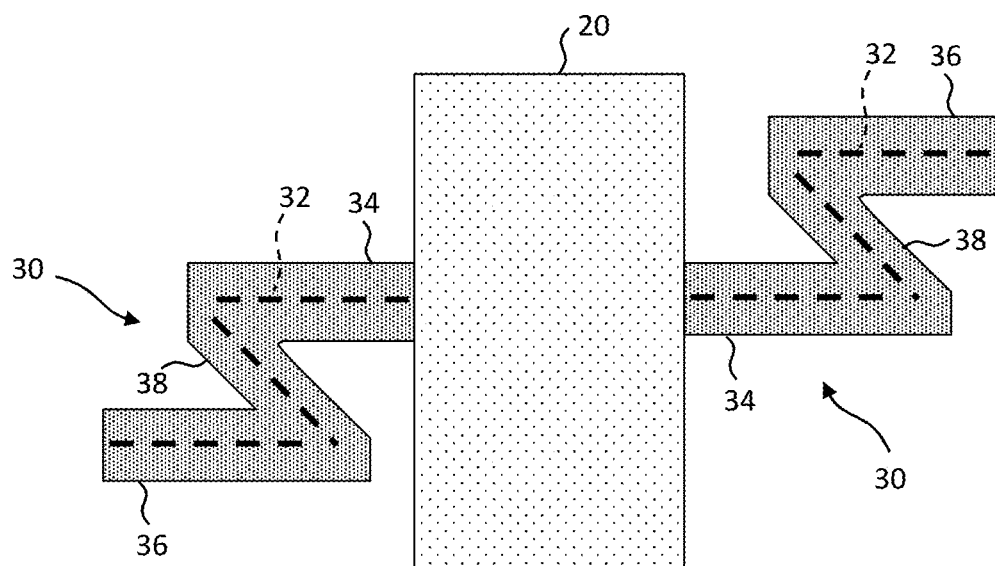
Figure 6B:
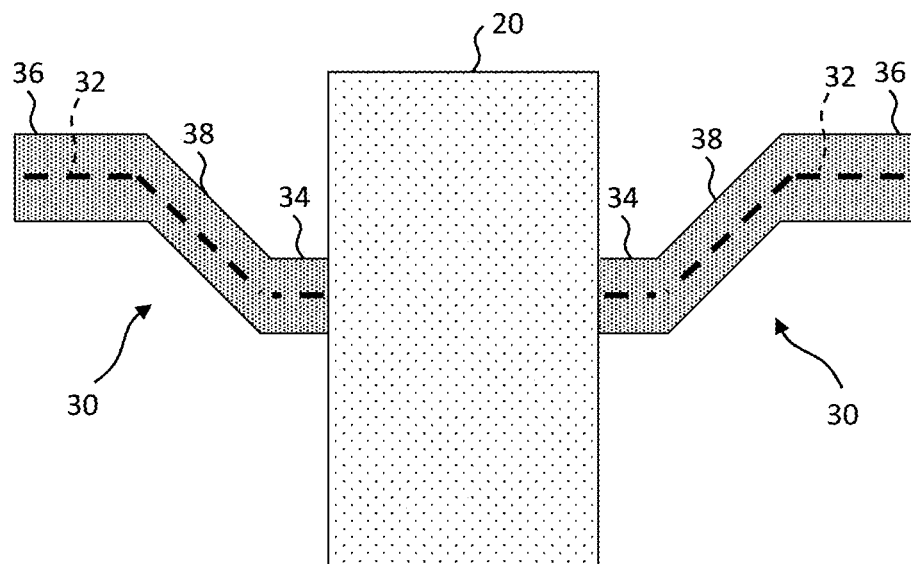

As shown in the embodiments illustrated in FIG. 6A, centerline 32 of tether 30 reverses direction, forming a zigzag path having acute angles between the connected portions (e.g., between tether device portion 34 and tether connection portion 38 and between tether substrate portion 36 and tether connection portion 38). As shown in FIG. 6A, a portion of centerline 32 can extend from tether device portion 34 to tether substrate portion 36 in a direction toward device 20, forming an acute angle in centerline 32. Thus, FIG. 6A illustrates an example of an acute Z-shaped tether 30. As shown in FIG. 6B, centerline 32 can extend from tether device portion 34 to tether substrate portion 36 in a direction toward an edge 18 of cavity 12 in substrate 10. FIGS. 6A and 6B are collectively referred to as FIG. 6.

Figure 8:
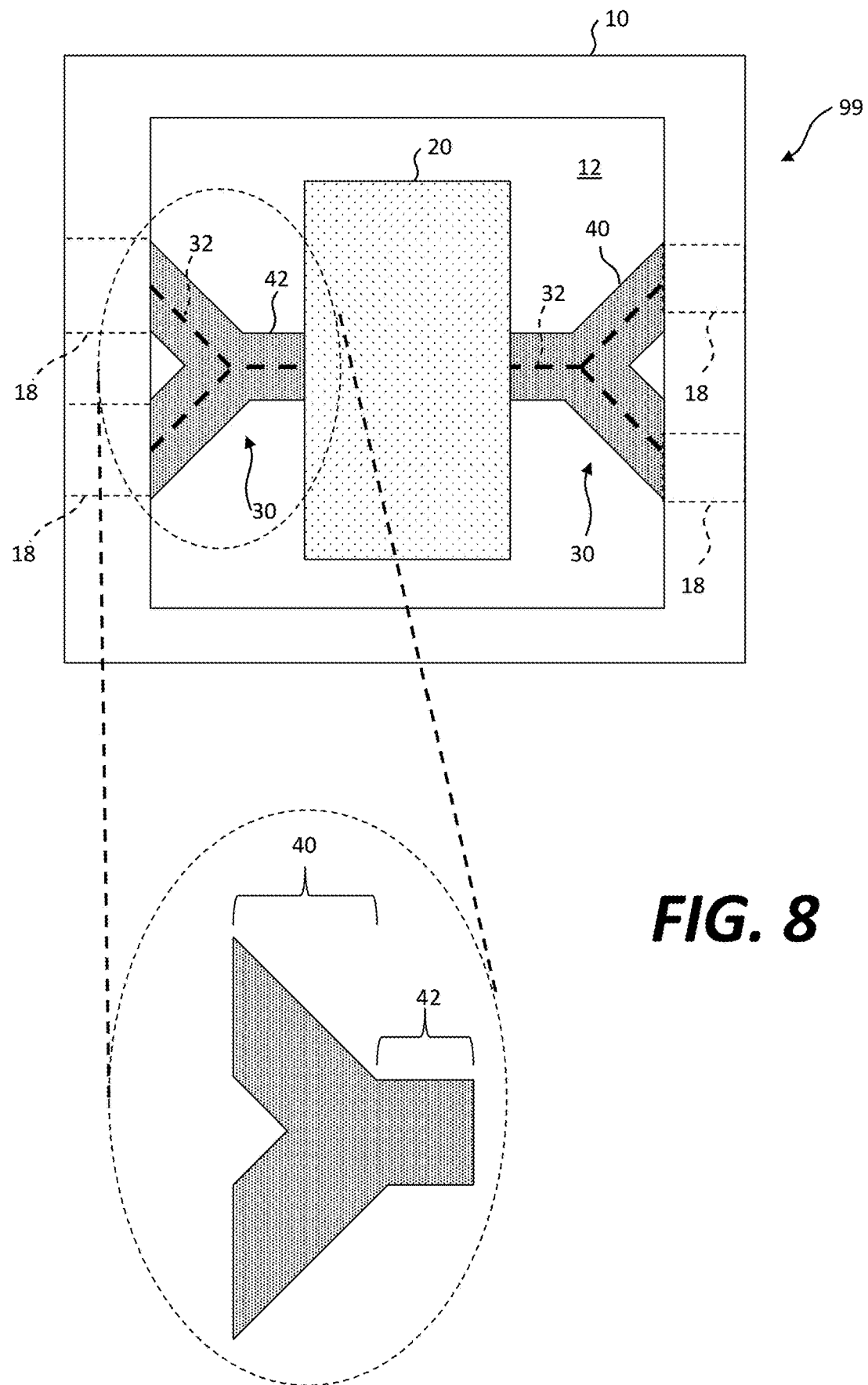
FIGS. 8-11 are plan views of branched tether structures according to illustrative embodiments of the present disclosure.

Although tethers 30 are illustrated as having a constant width W in FIGS. 5, 6A, and 8 in a plane and direction parallel to a surface of substrate 10, in some embodiments tethers 30 have a variable width W in a direction parallel to a surface of substrate 10, as shown in FIG. 6B (where tether device portion 34 and tether connection portion 38 have a narrower width than tether substrate portion 36).

Figure 7:
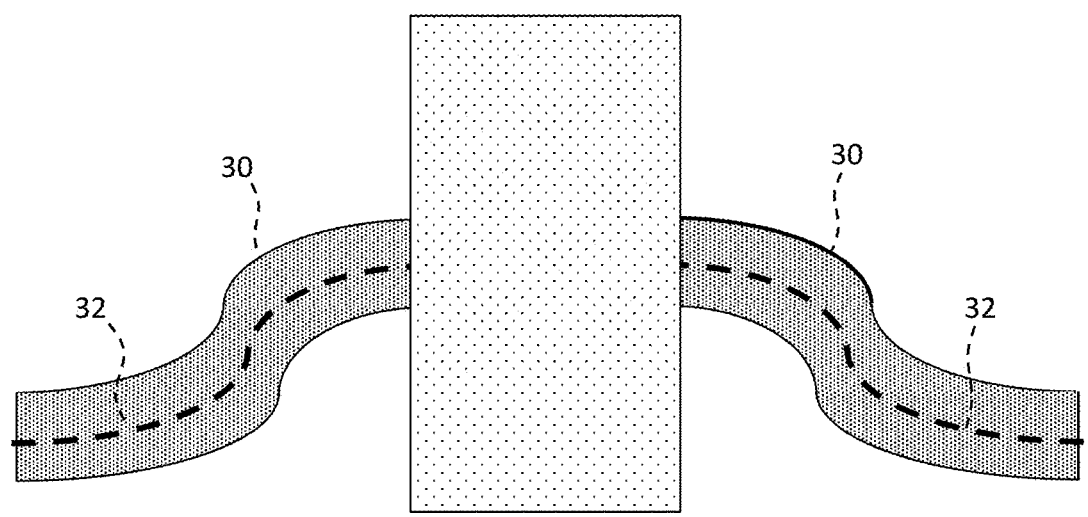

As shown in the embodiments illustrated in FIG. 7, tether 30 with centerline 32 is curved, for example at least partially curved (e.g., is curved). FIG. 7 illustrates a serpentine tether. A serpentine tether 30 can be, for example, S-shaped. A serpentine tether 30 can have a shape of a portion of a sine wave.

Figure 9:
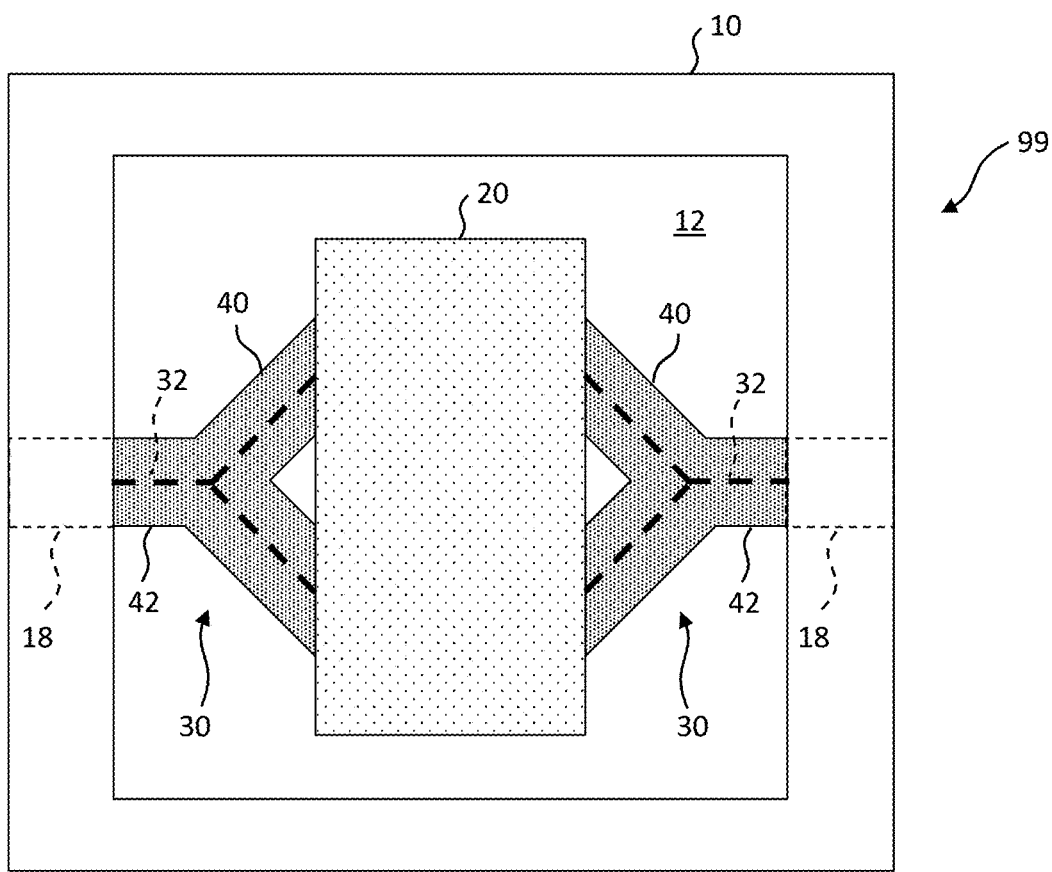
Figure 10:
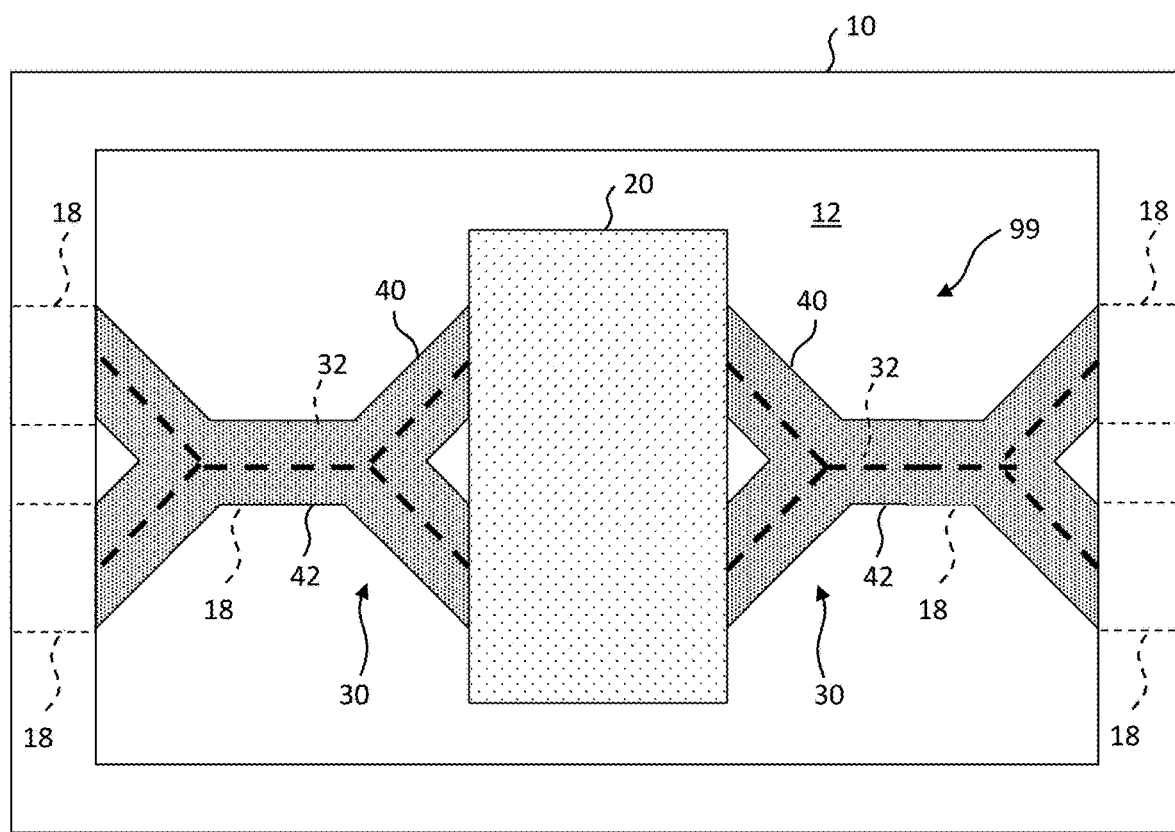
Figure 11:
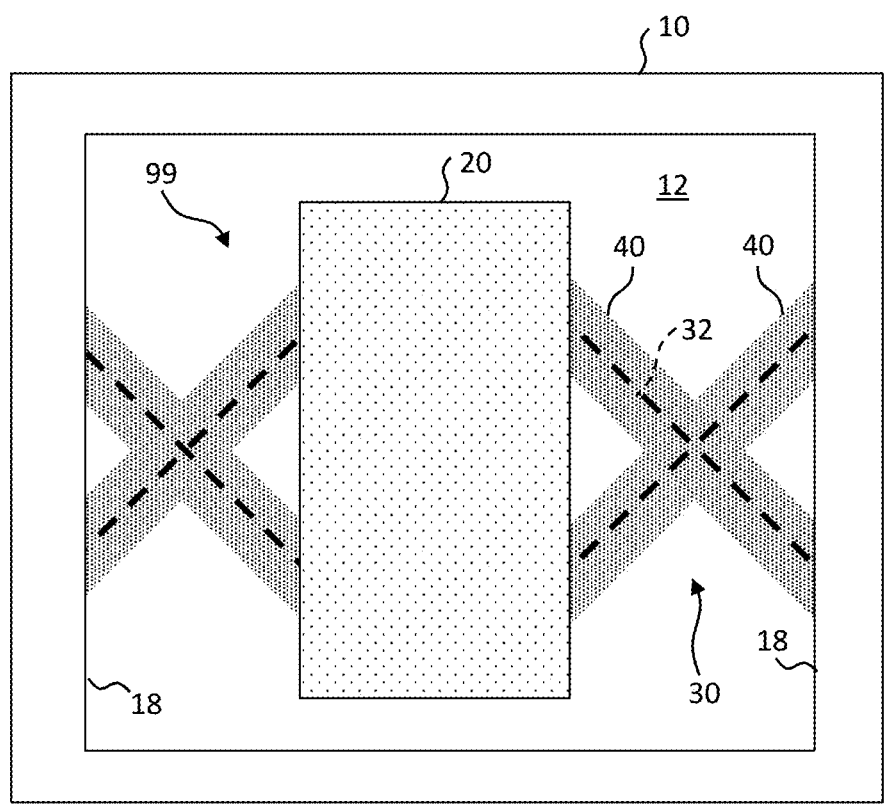
Figure 18:
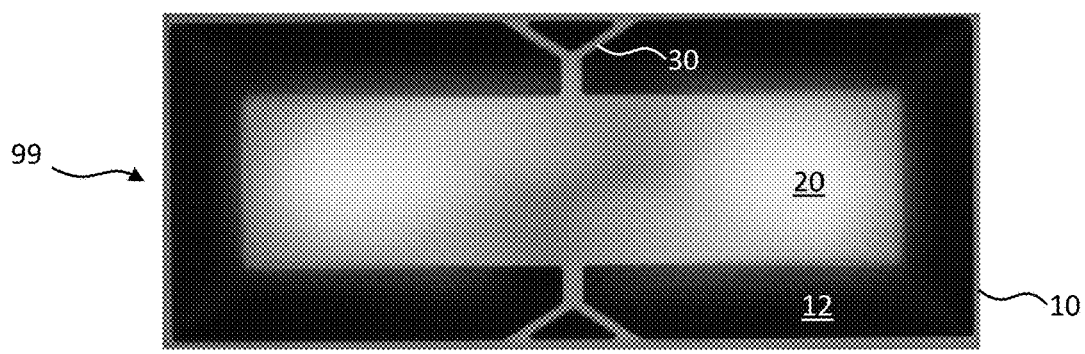
FIGS. 18-22 are plan view micrographs of suspended device structures and devices on source wafers taken along cross section lines A of FIG. 1C according to illustrative embodiments of the present disclosure.
Figure 19:
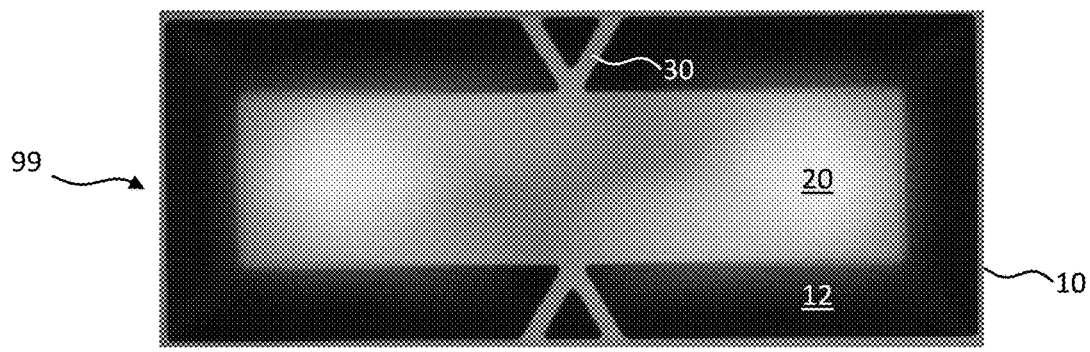
Figure 20:
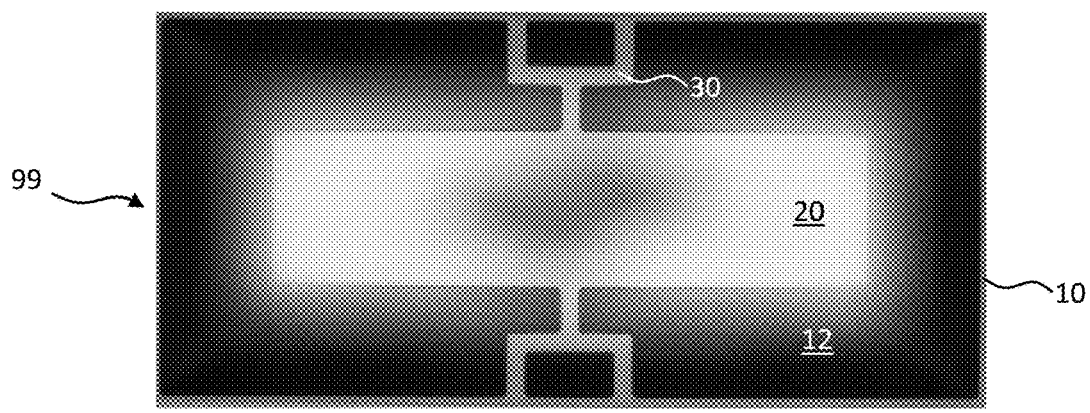

As shown in the embodiments illustrated in FIGS. 8-11 and as illustrated in the micro-graphs of FIGS. 18-20, in some embodiments of the present disclosure, tether 30 comprises an undivided tether portion 42 that divides into branches 40. As shown in FIGS. 8 and 18-20, branches 40 are attached to substrate 10 at an edge 18 of cavity 12. As shown in FIGS. 9-11, branches 40 are attached to device 20. In some embodiments, as illustrated in FIG. 11, branches 40 attach to both device 20 and substrate 10 and form an X-shaped tether 30. In some embodiments, as illustrated in FIG. 10, tether 30 can be double Y-shaped. Branches 40 can be longer or shorter than undivided tether portion 42 of tether 30. Branches 40 can be wider or narrower than undivided tether portion 42 of tether 30. For branched tethers 30, each branch 40 comprises a centerline 32 that bisects branch 40 (assuming no asymmetry in the branch 40). Tethers 30 comprising branches 40 longer than undivided tether portion 42 can facilitate releasing device 20 from substrate 10 by etching cavity 12 without damaging tethers 30 or device 20.

Figure 23:
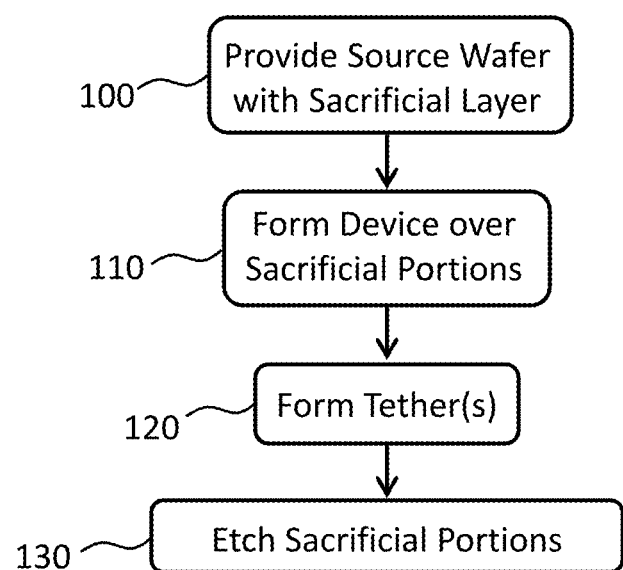
FIG. 23 is a flow diagram according to illustrative methods of the present disclosure.

According to some embodiments of the present disclosure and as shown in FIGS. 1-11 and 18-23, suspended device structure 99 can comprise multiple tethers 30 that attach device 20 to substrate 10, for example two tethers 30 disposed on opposing sides of device 20 and directly opposite each other. Tethers 30 can have centerlines 32 that intersect a center or centerline of device 20 in a dimension so that tethers 30 symmetrically suspend device 20 over cavity 12 and device 20 extends an equal distance in opposite directions from tethers 30. Thus, suspended device structure 99 can comprise a first tether 30 that physically connects device 20 to substrate 10 and a second tether 30 different from the first tether 30 that physically connects device 20 to substrate 10. First and second tethers 30 can be disposed on opposite sides of device 20 and attach to opposite sides of cavity 12 and can be disposed directly opposite each other with respect to device 20 or cavity 12, or both. First tether 30 can be a mirror reflection of second tether 30, for example as shown in FIGS. 1, 6B, 7, and 21. In some embodiments, first tether 30 is a rotation of second tether 30 (e.g., has a rotated orientation with respect to second tether 30, and vice versa), for example as shown in FIGS. 5, 6A, and 23. Where first and second tethers 30 are symmetric, they can be both a mirror reflection and a rotation, for example as shown in FIGS. 8-11 and 18-20. According to some embodiments of the present disclosure, a size and shape of second tether 30 is substantially identical to a size and shape of first tether 30. Thus, according to embodiments, tether 30 can be at least partially X-shaped (e.g., as shown in FIG. 11), V-shaped (e.g., as shown in FIG. 19), Y-shaped (e.g., as shown in FIGS. 8, 9, 18), S-shaped (e.g., as shown in FIG. 7), double Y-shaped (e.g., as shown in FIG. 10), acute Z-shaped (e.g., as shown in FIG. 6A), obtuse Z-shaped (e.g., as shown in FIG. 6B), oblique Z-shaped (e.g., either acute or obtuse), or right Z-shaped (e.g., as shown in FIGS. 1, 5, 21-23).

FIGS. 1A, 1C, 1D, 4-11, and 18-22 show devices 20 connected to substrate 10 by two tethers 30 disposed on opposite sides of device 20. However, in some embodiments, only one tether 30 disposed on one side of device 20 connects device 20 to substrate 10. Additionally, in some embodiments, two or more (e.g., three or more) tethers 30 disposed on one or more sides of device 20 connect device 20 to substrate 10.

Top electrode 50 can extend along a surface of first tether 30 (e.g., a top side of first tether 30) and bottom electrode 52 can extend along a surface of second tether 30 (e.g., a bottom side of second tether 30, for example as shown in FIG. 2A).

Figure 12:
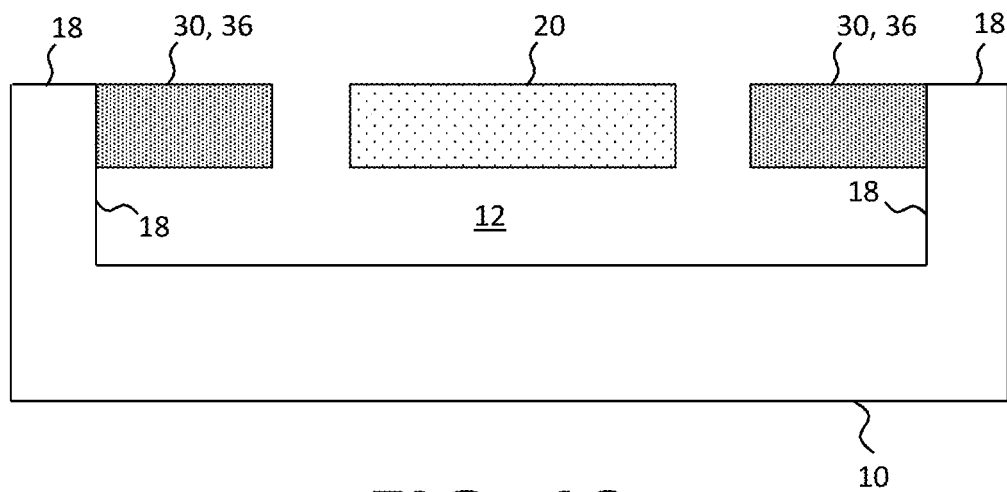
FIGS. 12-13 are cross sections of suspended device structures having non-linear tethers according to illustrative embodiments of the present disclosure.
Figure 13:
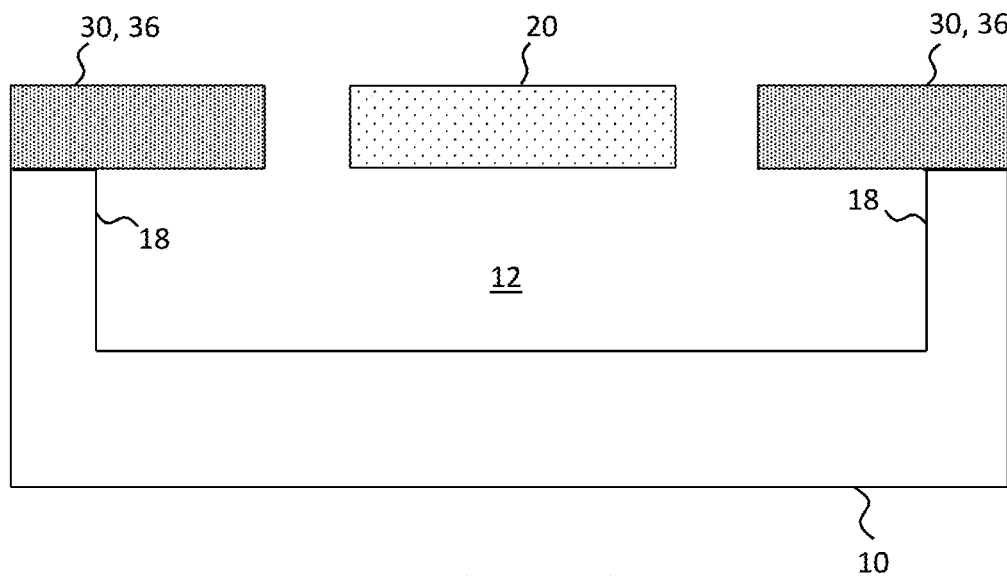
Figure 14:
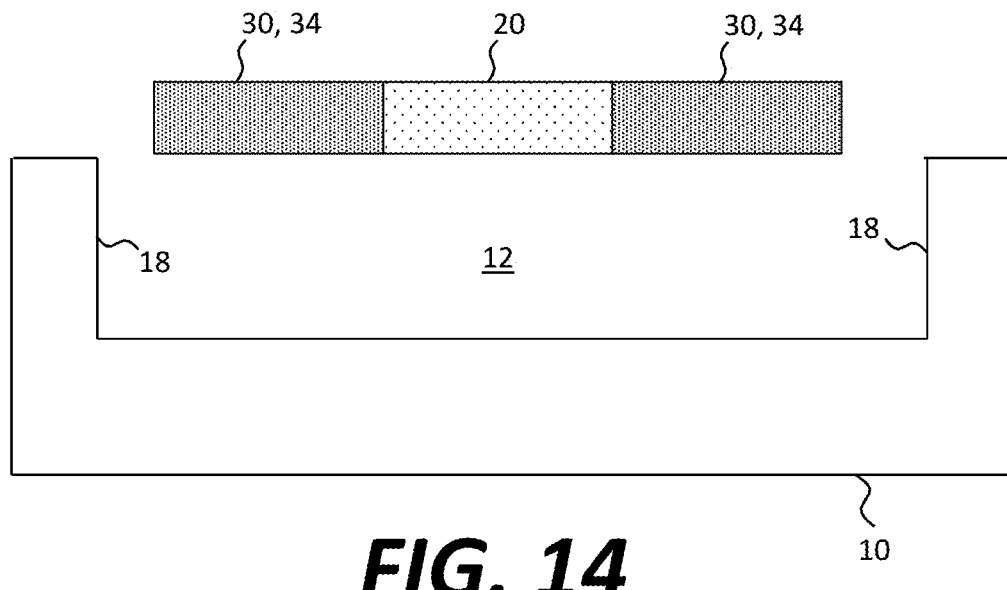
FIGS. 14-15 are cross sections of suspended device structures having non-linear tethers according to illustrative embodiments of the present disclosure.
Figure 15:
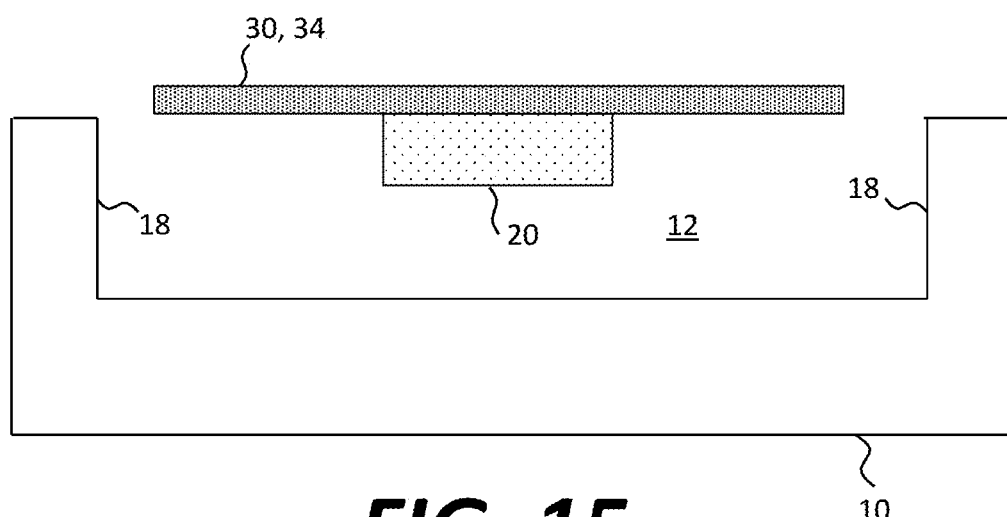

As shown in some embodiments and as illustrated in FIGS. 12-15, devices 20 can be attached to substrate 10 in a variety of ways and with a corresponding variety of structures. As shown in FIG. 12 in a cross section of suspended device structure 99 taken across cross section line B of FIG. 1C, tethers 30 are attached to a side, wall, anchor, or edge 18 of cavity 12. As shown in FIG. 13, tethers 30 are attached to a surface of substrate 10 above cavity 12. As shown in FIG. 14, device 20 can be constructed in a common layer or plane with tethers 30 or, as shown in FIG. 15, device 20 can be disposed in a layer beneath tethers 30. Thus, device 20 that is suspended entirely over a bottom portion of cavity 12 can be disposed, for example, completely within cavity 12, at least partially in cavity 12, or completely above cavity 12. The various structures can be made using photo-lithographic methods and materials known in the integrated circuit and MEMS industry, for example, and the selection of a specific structure can complement a desired construction process for a desired device 20.

Figure 16:
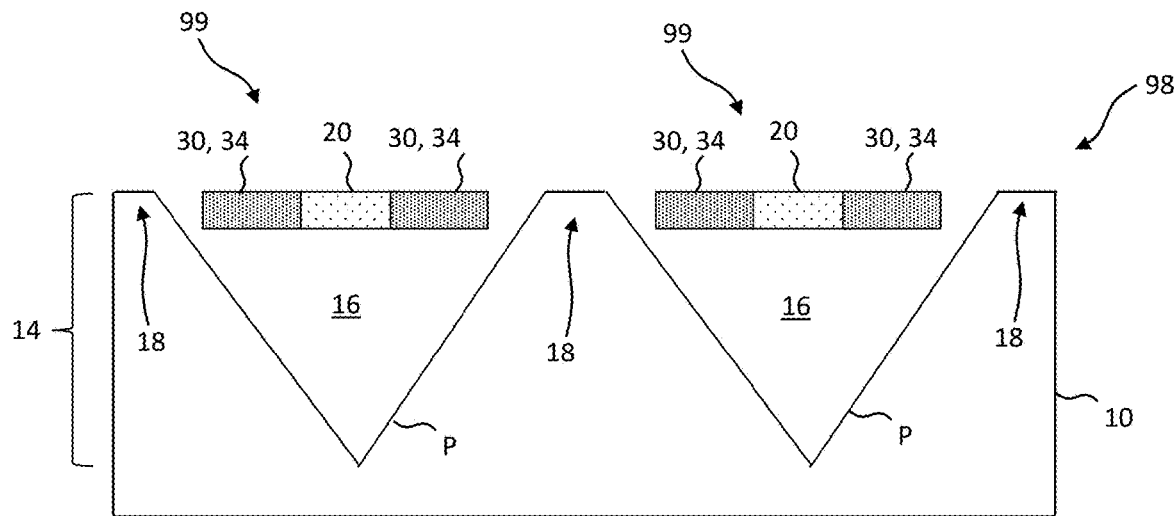
FIG. 16 is a cross section illustrating suspended device structures having non-linear tethers and devices on a source wafer taken along cross section line A of FIG. 1C according to illustrative embodiments of the present disclosure.
Figure 17:
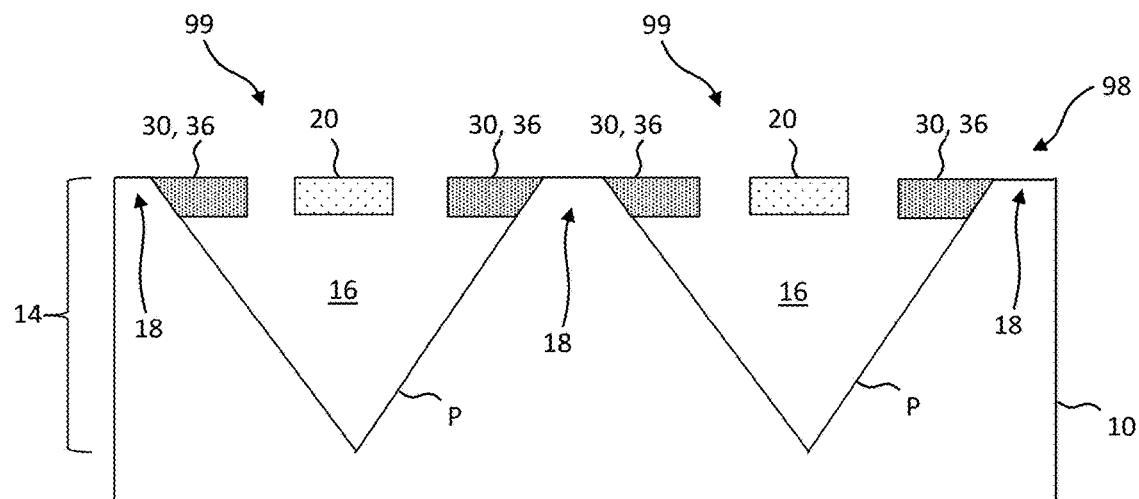
FIG. 17 is a cross section illustrating suspended device structures and devices on a source wafer taken along cross section line B of FIG. 1C according to illustrative embodiments of the present disclosure.

According to some embodiments of the present disclosure and as shown in FIGS. 16 and 17, a wafer structure 98 comprises a substrate 10 comprising a patterned sacrificial layer 14 defining one or more anchor portions 18 separating one or more etched sacrificial portions 16. Etched sacrificial portions 16 can correspond to cavities 12. One or more devices 20 are each suspended entirely over an etched sacrificial portion 16 of the one or more etched sacrificial portions 16 at least by a tether 30 that physically connects device 20 to an anchor portion 18 of the one or more anchor portions 18. Tether 30 has a centerline 32 that comprises non-collinear points. A first tether portion can be separated from a second tether portion, e.g., in a direction parallel to a device edge 21 from which tether 30 extends. In some embodiments, the tethers are separated by a distance D that is at least a width W of tether 30. In some embodiments, centerline 32 can have a first centerline portion separated from a second centerline portion by a distance L3 that is at least twice a width W of tether 30. In some embodiments, device 20 comprises a device material and one or more electrodes disposed on one or more sides of device 20, and (i) the one or more electrodes are in contact with at least 10% of at least one side of device 20, (ii) the device material is a piezoelectric material 54, or (iii) both (i) and (ii).

Substrate 10 can be a source wafer and each device 20 can be disposed completely over a sacrificial portion 16. FIG. 16 is a cross section taken along cross section A of FIGS. 1A and 1C of a source wafer (substrate 10) with multiple etched sacrificial portions 16 forming inverted pyramids P (cavity 12) and devices 20 suspended over the cavity 12. FIG. 17 is a cross section of taken along cross section B of FIG. 1C of a source wafer (substrate 10) with multiple sacrificial portions 16 (cavity 12) and devices 20 suspended over the cavity 12. FIGS. 16 and 17 illustrate devices 20 connected to source wafer 10 with right Z-shaped tethers. (For clarity, the inverted pyramids P are not illustrated in FIGS. 1B, 2A-2C, and 12-15.)

FIGS. 18-22 are micrographs of a device 20 physically connected to substrate 10 and suspended over cavity 12 (formed by etching a portion of substrate 10). FIG. 18 illustrates branched tethers 30 corresponding to FIG. 8. In FIG. 18, branches 40 are narrower than undivided tether portion 42 and the tether branch junctions do not have any right angles. FIG. 19 illustrates branches 40 that connect to a common point on device 20 (in a V shape). In FIG. 19, a vertex of the tether is disposed near an edge of the device. Although not shown, a suspended device structure 99 could comprise branches 40 that connect to a common point on substrate 10 (e.g., an edge 18 of cavity 12). FIG. 20 comprises branches 40 are not angled but have a line segment portion that is parallel to an edge 18 of cavity 12 and a line segment portion that is orthogonal to the edge 18 of cavity 12. That is, in FIG. 20, the tether branch junctions have right angles. FIG. 21 corresponds to FIG. 1 and FIG. 22 corresponds to FIG. 5. Tethers 30 are mirrored in FIG. 21. In FIG. 21 (and separately in FIG. 22), tethers 30 have substantially identical sizes and shapes and can be congruent if rotated or reflected.

As shown in FIGS. 18-22, embodiments of the present disclosure have been constructed and demonstrated using an AlN piezoelectric material 54 with top and bottom electrodes 50, 52 to form a rectangular device 20 with opposing tethers 30 disposed at a central point of device 20 in the long direction. Bottom electrode 52 extends under one tether 30 and top electrode 50 extends over the top of device 20 (as shown in FIG. 2A).

As shown in FIG. 23, embodiments of the present disclosure can be constructed by providing a source wafer 10 with a sacrificial layer 14 in step 100. The source wafer 10 serves as substrate 10 as described above and can be provided as monocrystalline silicon (100). In step 110, source wafer 10 is processed to form device 20 and, in step 120 tethers 30, (such as any electrodes) when source wafer 10 is etched). Device 20 and tethers 30 can be constructed in a common step (so that steps 110 and 120 are the same step, or in separate steps 110 and 120, with the same, similar, or different materials using photolithographic methods and materials known in the integrated circuit and MEMs industries. Tethers 30 can be formed by, for example, depositing a layer of and patterning it or by pattern-wise depositing material.

Sacrificial portions 16 are etched in step 130, for example with TMAH or KOH, to form cavity 12 beneath device 20 and tethers 30 and release device 20 and tethers 30 from source wafer 10, leaving device 20 physically connected with tethers 30 to an anchor portion 18 at the edge 18 of cavity 12 or on a portion of source wafer 10 at the edge 18 of cavity 12. Thus, according to some embodiments, a method of making a suspended device structure 99 comprises forming a device 20 on a substrate 10 entirely over a sacrificial portion 16 of substrate 10, forming a tether 30 having a non-linear centerline 32, and etching sacrificial portion 16 of substrate 10 without substantially etching device 20 or tether 30 to form a cavity 12 disposed in a surface of substrate 10 and to suspend device 20 entirely over a bottom of cavity 12, wherein (a) a first tether portion is separated from a second tether portion by a distance that is at least a width W of tether 30, (b) device 20 comprises a device material and one or more electrodes disposed on one or more sides of the device material, and (i) the one or more electrodes are in contact with at least 10% of at least one side of the device material, (ii) the device material is a piezoelectric material 54, or (iii) both (i) and (ii), or (c) both (a) and (b). Forming tether 30 can comprise any one or more of: forming a layer on substrate 10 and patterning the layer, pattern-wise depositing material, and forming device 20 comprises printing an unpackaged bare die component on an intermediate substrate disposed on substrate 10.

According to various embodiments of the present disclosure, non-linear (e.g., non-collinear or serpentine) tethers 30 can comprise a variety of shapes, as illustrated. In some embodiments, device 20 is a MEM device that employs acoustic resonance to process, respond to, or generate electrical signals. Acoustic resonance in device 20 is a resonant mechanical vibration that can be affected by the structure of device 20, for example piezoelectric material 54, dielectric layers, protective encapsulation layers, or top and bottom electrodes 50, 52. Tethers 30 can also affect the acoustic resonance of device 20. Hence, depending on the desired nature of device 20 acoustic resonance (e.g., magnitude, frequency, wavelength, direction), different tether 30 structures can be preferred. For example, sharp device 20 or tether 30 edges can induce high-frequency acoustic reflections and angled, or curved edges can tend to dampen or redirect such reflections, at least in device 20. Tethers 30 can be disposed at locations that promote desired vibrations, for example at null spots where vibrations are out of phase or extending from one null spot to another on device 20. Thus, in some embodiments, tether 30 can be disposed at or near a midpoint of device edge 21 from which it extends (and/or at or near a midpoint of cavity wall 18) or can be offset toward one end of device edge 21 from which it extends.

The present disclosure provides, inter alia, structures and methods for improving the release of a micro-transfer-printable device 20 structure 97 from source wafer 10 (substrate 10) by etching, in particular as in some embodiments where sacrificial layer 14 in source wafer 10 (substrate 10) comprises an anisotropically etchable crystalline semiconductor material such as silicon {111} or silicon {100}. According to some embodiments of the present disclosure, FIGS. 24A-24B, 25A-25B, and 26A-26C illustrate a device structure 97 comprising substrate 10 and a patterned sacrificial layer 14 disposed on or in substrate 10. Patterned sacrificial layer 14 defines sacrificial portions 16 comprising a sacrificial material laterally spaced apart by anchor portions 18. Anchor portions 18 can be or include a non-sacrificial portion of sacrificial layer 14 (e.g., arranged to remain unetched by an etchant while sacrificial portion 16 is etched), can be disposed over sacrificial layer 14 (e.g., comprising a material deposited on an initial substrate), or both. As illustrated, anchor portions 18 comprise a non-sacrificed portion of sacrificial layer 14 and material deposited on sacrificial layer 14, for example the same material deposited to form devices 20 in a common step or a deposited encapsulating material (e.g., encapsulation layer 80) in a common step. A device 20 is disposed entirely and completely over each sacrificial portion 16 and is physically connected to anchor portion 18 by tether 30. An encapsulation layer 80 comprising an encapsulation material can encapsulate any one or combination of devices 20, tether 30, and anchor portion 18, for example as shown in FIGS. 25A-26C. In some embodiments, encapsulation layer 80 forms tether 30 or a portion of tether 30 so that tether 30 comprises encapsulation layer 80 or the encapsulation material. In some embodiments, encapsulation layer 80 forms anchor portion 18 or a portion of anchor portion 18. In some embodiments, sacrificial portion 16 is etched such that device remains suspended over recess (cavity) 12 in or on substrate 10 by tether 30 connected to anchor portion 18, for example in accordance with FIGS. 25A-26C if sacrificial portion 16 were removed by an etchant. Recess 12 in or on substrate 10 is formed by etching of sacrificial portion 16.

Figure 24A:
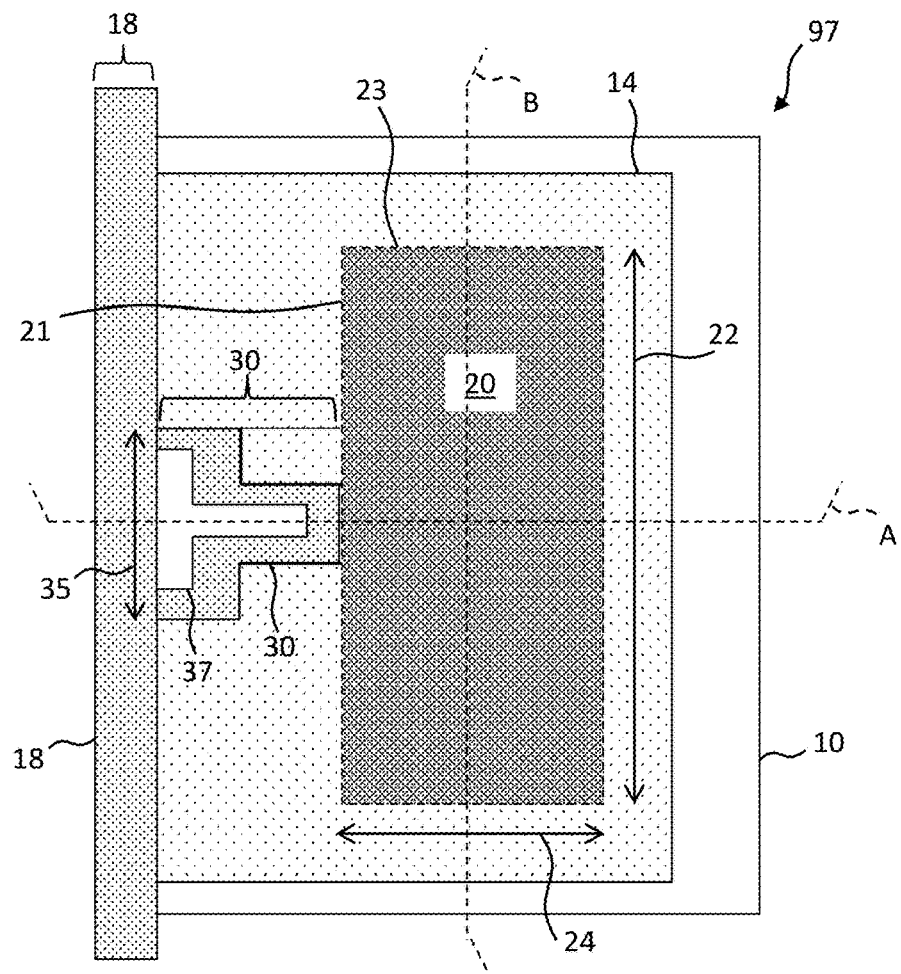
FIG. 24A is a plan view of a device structure and FIG. 24B is a width-wise cross section of the device structure of FIG. 24A taken across cross section line A according to illustrative embodiments of the present disclosure.
Figure 24B:
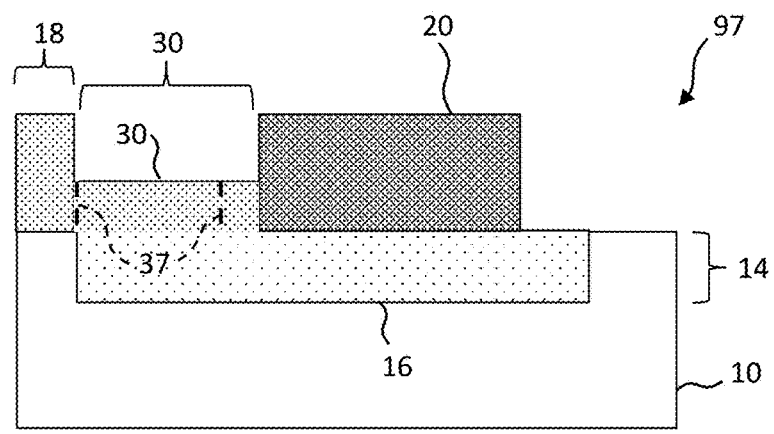
Figure 25A:
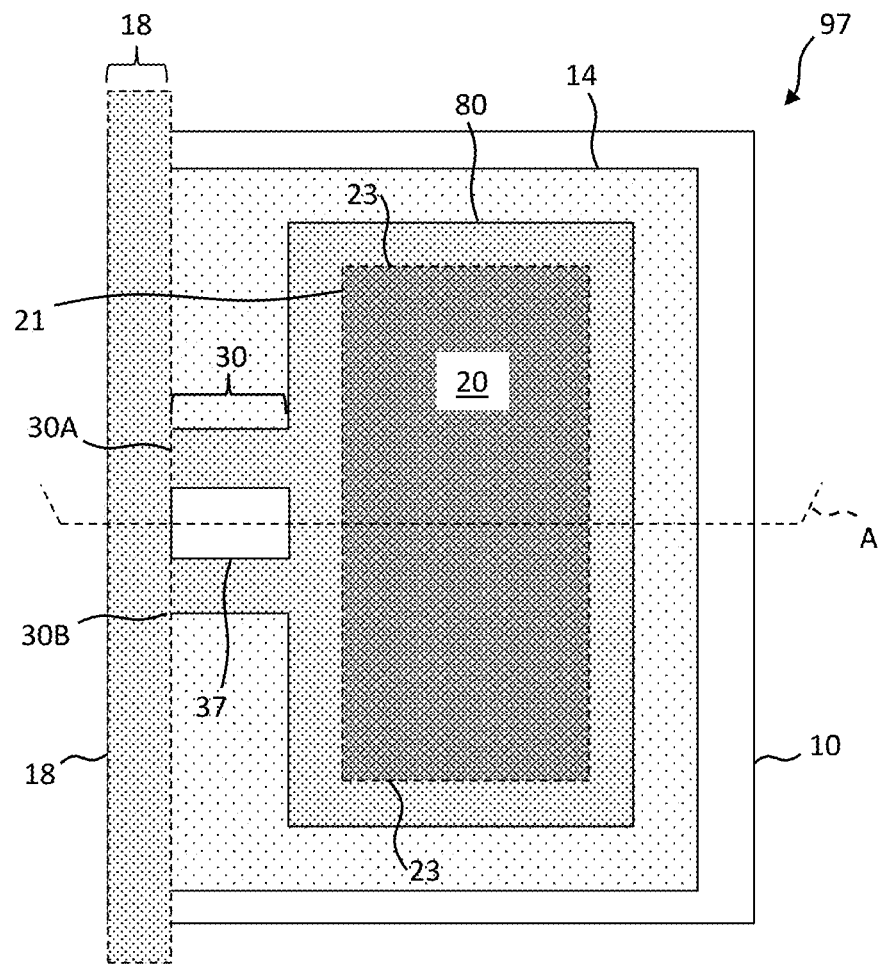
FIGS. 25A and 25B are plan views of device structures according to illustrative embodiments of the present disclosure.
Figure 25B:
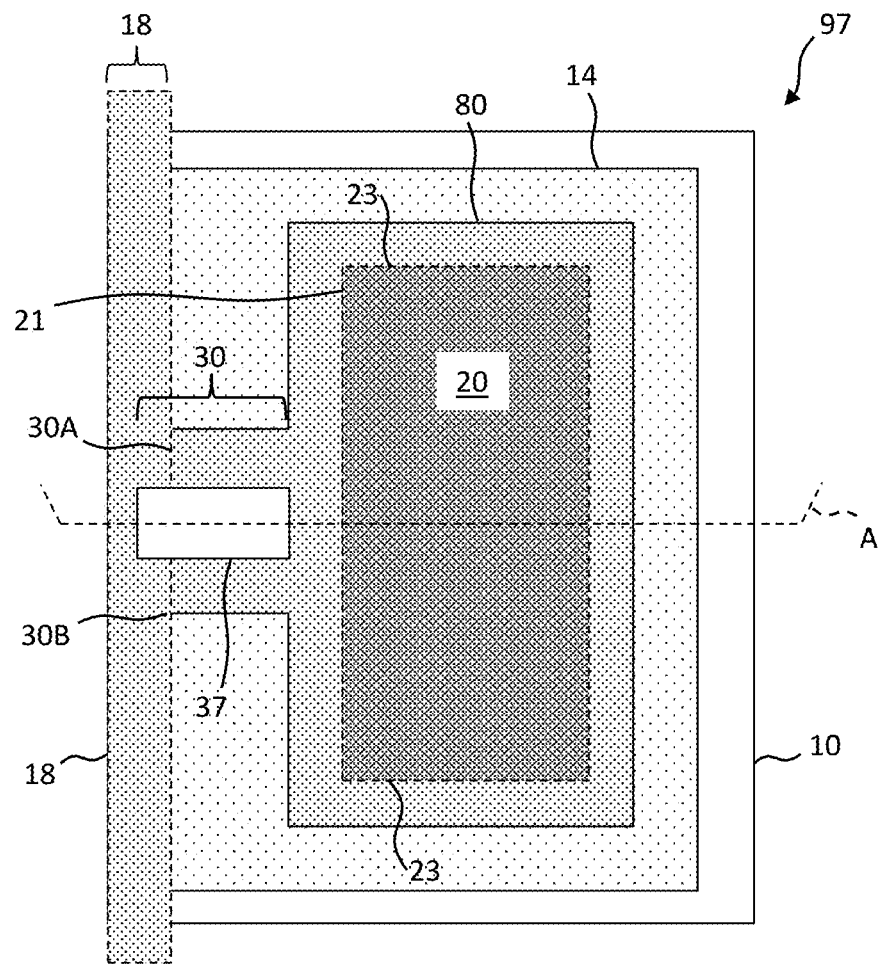
Figure 26A:
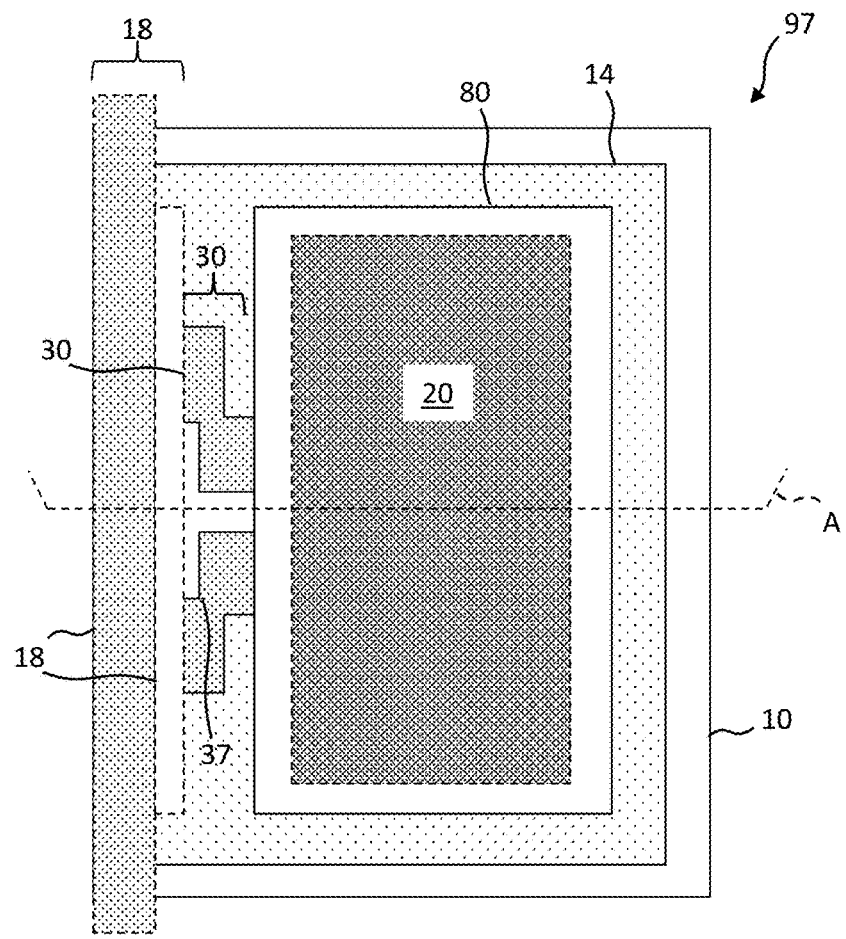
FIG. 26A is a plan view of a device structure and FIG. 26B is a cross section of the device structure of FIG. 26A taken across cross section line A according to illustrative embodiments of the present disclosure.
Figure 26B:
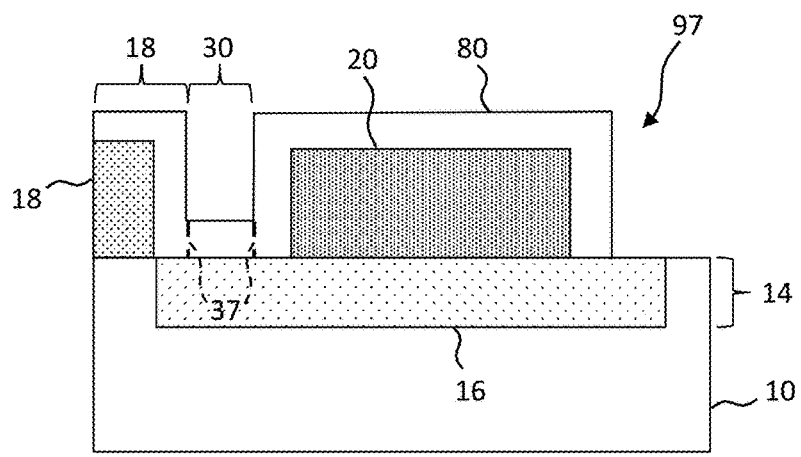
Figure 26C:
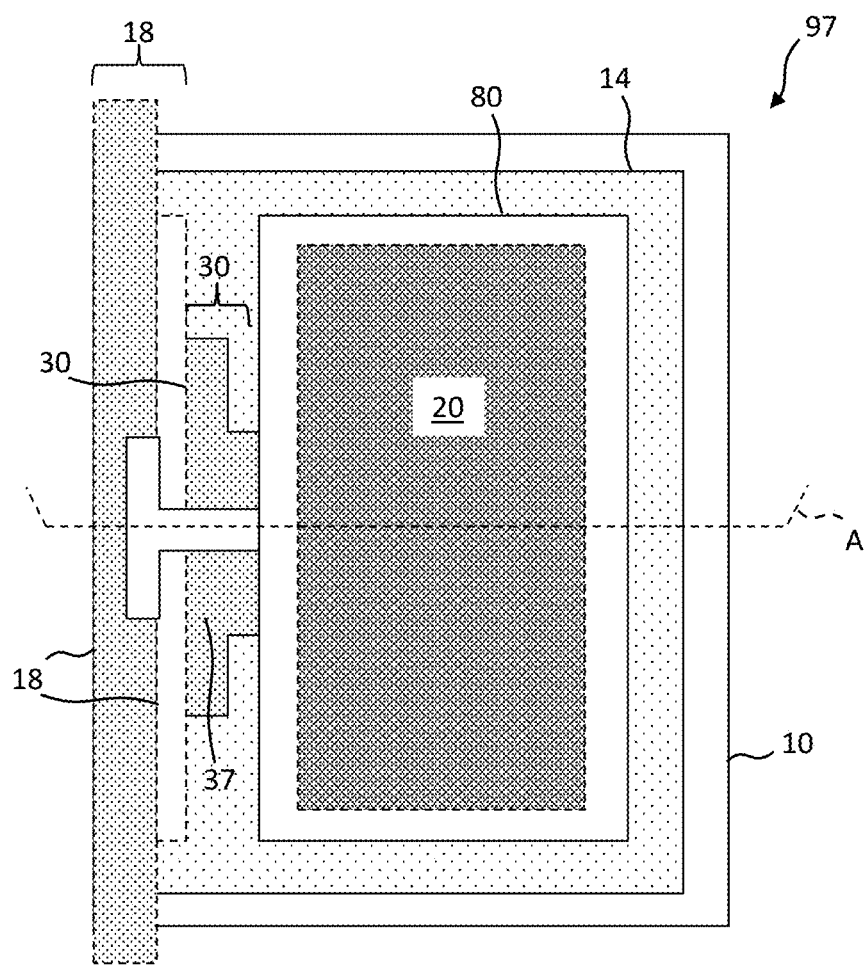
FIG. 26C is a plan view of a device structure having a T-shape tether opening extending into an anchor portion according to illustrative embodiments of the present disclosure.

According to embodiments of the present disclosure, a tether opening 37 is disposed in tether 30 that extends through tether 30. Tether opening 37 can be a hole, for example a shaped hole. An etchant, for example a liquid etchant, can be disposed over tether 30 on a side of tether 30 opposite sacrificial portion 16 and pass through tether opening 37 to contact and etch sacrificial portion 16. Tether opening 37 can have various shapes and is necessarily smaller than tether 30 in at least one dimension. In some embodiments, tether opening 37 has a shape approximately similar or geometrically similar (e.g., having the same relative proportions) as tether 30. Tether opening 37 can be in contact with anchor portion 18 (for example as shown in FIGS. 24A, 24B, 25A, 26A-26B), can be in contact with device 20 (for example as shown in FIGS. 25A-26C), in contact with both anchor portion 18 and device 20 (for example as shown in FIGS. 25A, 26A-26B), or can extend into anchor portion 18 (for example as shown in FIGS. 25B, 26C). In some embodiments, device 20 comprises encapsulation layer 80 so that tether 30 (and tether opening 37) in contact with encapsulation layer 80 is also in contact with device 20. In some embodiments, device 20 and encapsulation layer 80 are separate structures so that tether 30 (and tether opening 37) in contact with encapsulation layer 80 is not in contact with device 20. In some embodiments in which tether opening 37 contacts both anchor portion 18 and device 20, for example as shown in FIGS. 25A, 25B, tether 30 can be viewed as two separate and adjacent tethers 30 divided by tether opening 37.

In some embodiments, and as shown in FIG. 25A, tether opening 37 is rectangular and is in contact with and adjacent to anchor portion 18. In some embodiments, and as shown in FIG. 25B, tether opening 37 is rectangular and extends into anchor portion 18 and overlaps a portion of anchor 18. In some embodiments, and as shown in FIGS. 24A-24B and FIGS. 26A-26C, tether 30 has a T-shape with a tether crossbar portion in contact with or extending into anchor portion 18 and a tether upright portion in contact with device 20 or in contact with encapsulation layer 80 encapsulating device 20. A T-shape 60 is illustrated separately in FIG. 24C with a crossbar 62 and upright 64. Similarly, tether opening 37 can have an opening crossbar 62 and an opening upright 64. According to some embodiments, opening crossbar 62 is in contact with anchor portion 18, opening upright is in contact with device 20 or encapsulation layer 80, or both (as shown in FIGS. 26A-26B). In some embodiments, tether opening 37 crossbar 62 is at least partially disposed in anchor portion 18 (as shown in FIG. 26C).

Figure 24C:
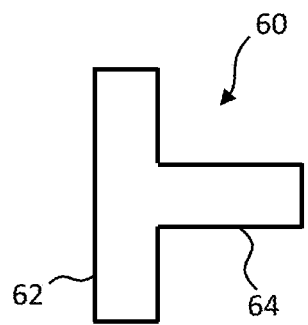
FIG. 24C is a detail plan view of a T-shape useful in understanding illustrative embodiments of the present disclosure.
Figure 24D:
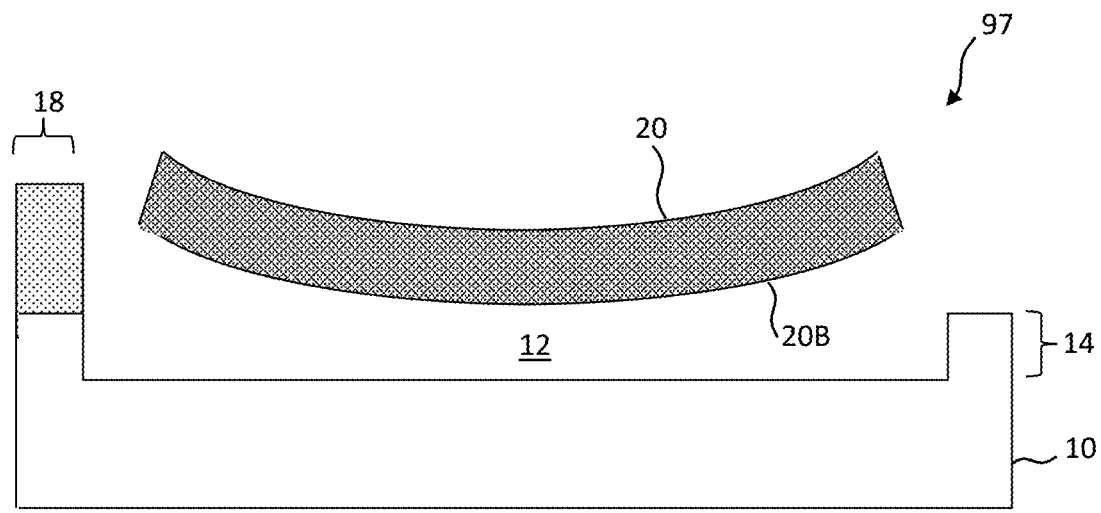
FIG. 24D is a length-wise cross section along cross section line B of FIG. 24A according to illustrative embodiments of the present disclosure.

Micro-devices 20, such as certain of those of the present disclosure, typically incorporate layers of different materials, for example including one or more of semiconductors such as silicon or compound semiconductors such as III-V (e.g., GaAs or GaN) or II-VI semiconductors, with or without doping, oxides such as silicon dioxide, nitrides such as silicon nitride, organic materials such as epoxies or resins, and metals. Such materials can be deposited in layers and can have an inherent stress, for example from different types of atoms within a crystalline structure or from different layers with different crystal structures. Stress can also be introduced or induced by any encapsulating dielectric layer (e.g., encapsulation layer 80). Such stress can cause a device to bend, warp, curve, or curl so that, for example, a device top surface or device bottom surface 20B of device 20 is curved, particularly after device 20 is at least partially released from substrate 10 so that recess 12 is formed from which any etchable material has been removed by etching, for example as shown in FIG. 24D and FIG. 27B (where recess 12 is in the process of being formed). The stress and consequent bending can stress tethers 30 connecting device 20 to anchor portions 18. The device 20 stress can be so severe that tethers 30 can crack, especially tethers provided at opposite ends of device 20. Such stress or cracking can prevent the successful fabrication of device 20 (e.g., a suspended MEMS structure) that can withstand elastomer-stamp Van der Waals contact forces during micro-transfer printing and can cause particulate contamination within the release chemical bath or otherwise during the stamp pickup process. This problem can be noticeable for devices 20 that have a longer device length 22 than a device width 24 (for example as shown in FIG. 24A) and can be especially acute for devices 20 that have a device length 22 that is at least twice as great as a device width 24 (e.g., device length 22 is greater than or equal to two times device width 24).

According to embodiments of the present disclosure, these problems can be mitigated by providing tethers 30 that are sufficiently large that they do not crack and, in some embodiments are centered symmetrically about the length-wise center of device 20. Furthermore, a single tether 30 rather than two or more tethers 30 can reduce particulate contamination resulting from fracturing tether 30. Sufficiently large tethers 30 can, according to embodiments of the present disclosure, have a tether length 35 that is one third or greater than device length 22, as shown in FIG. 24A. However, the use of larger tethers 30 makes device 20 pickup by a micro-transfer printing stamp more difficult, for at least two reasons. First, a larger tether 30 is stronger and will not fracture as easily and, second, for sacrificial portions comprising anisotropically etched material such as silicon {100} or silicon {111} and structures having only concave corners, etching proceeds much more slowly in sacrificial portion 16 under tether 37 and requires a longer etch time to release device 20 from substrate 10 with a useful tether 30 for micro-transfer printing. A longer etch time undesirably increases manufacturing time and can potentially damage other materials or structures in device 20, for example that are etchable by the etchant being used albeit at an appreciably lower etch rate.

These issues are addressed, according to embodiments of the present disclosure, by providing tether opening 37 in tether 30. Tether opening 37 provides access to etchants and can have convex angles that enable fast etching beneath tether 30. Sacrificial portion 16 etchants pass through tether opening 37 to attack sacrificial portion 16 beneath tether 30 at convex corners, decreasing the time necessary to fully release device 20 and tether 30 from substrate 10 and prepare device 20 for micro-transfer printing with a stamp. Thus, a combination of a relatively larger tether 30 (e.g., having a tether length 35 that is at least one third of device length 22) that suppresses problems with device 20 stress (often found in devices 20 having device length 22 at least twice that of device width 24) with a tether opening 37 having convex corners enables fast and efficient device 20 release from substrate 10. Thus, according to embodiments of the present disclosure, device 20 has a device length 22 that is longer than a device width 24. Device width 24 can be no greater than one half of device length 22. Tether 30 can have a tether length 25 that is at least one third of device length 22. Tether 30 can have tether opening 37 and, in some embodiments, tether opening 37 has convex corners, for example as in a T-shape tether opening 37.

The use of a T-shape 60 tether 30 can assist in fracturing tether 30 in a controlled fashion that is more predictable with less particulate contamination. T-shape 60 forms concave and convex corners that assist the etch progression during device 20 release, reducing etch time. Planes exposed by the concave corners will etch to a depth similar to a depth of cavity 12 formed surrounding device 20. Planes exposed by the convex corners assist etching underneath tether 30 without significantly reducing the structural support provided by tether 30 connecting anchor portion 18 to device 20. Tether length 35 can be the length of tether 30 in contact with either anchor portion 18 (as shown in FIG. 24A) or device 20 (not shown). According to embodiments of the present disclosure, therefore, a device structure 97 comprises a substrate 10 having a sacrificial layer 14 comprising a sacrificial portion 16 adjacent to an anchor portion 18, a device 20 disposed completely over sacrificial portion 16, and a tether 30 that physically connects device 20 to anchor portion 18. Tether 30 can have a T-shape 60 comprising a tether 30 crossbar 62 and tether 30 upright 64. In some embodiments, tether 30 cross bar 62 is attached to or in contact with anchor portion 18, tether 30 upright 64 is attached to or in contact with device 20, or both tether 30 cross bar 62 is attached to or in contact with anchor portion 18 and tether 30 upright 64 is attached to or in contact with device 20. In some embodiments, tether opening 37 is disposed in tether 30 and extends through tether 30. Substrate 10 can comprise silicon 1 0 0. Device 20 can have a device bottom surface 24B adjacent to substrate 10 and the device bottom surface 24B can be curved. Sacrificial portion 16 can be a cavity, recess, or gap 12. Device 20 can have a device length 22 and a device width 24 that is no greater than one half of device length 22. Tether 30 can have a tether length 35 and tether length 35 can be at least one third of device length 22.

According to some embodiments of the present disclosure, a device structure, 97 comprises a substrate 10 having a sacrificial layer 14 defining a sacrificial portion 16 adjacent to an anchor portion 18 and a device 20 disposed completely over sacrificial portion 14. Device 20 has a device length 22 and a device width 24. The device length 22 extends in a direction along a device edge 21 to a device end 23. A first tether 30A physically connects device 20 to anchor portion 18, a second tether 30B physically connects device 20 to anchor portion 18, and first tether 30A is closer to second tether 30B than to device end 23 and second tether 30B is closer to first tether 30A than to device end 23. Device length 22 can be longer than device width 24 and device width 24 can be no greater than one half of device length 22. Tether 30 can have a tether length 35 that is at least one third of device length 22. Substrate 10 can comprise silicon 1 0 0. Device 20 can have a device bottom surface 24B adjacent to substrate 10 that is curved, curled, or warped. Sacrificial portion 16 can be etched leaving recess 12.

According to some embodiments of the present disclosure, a device structure 97 comprises substrate 10 having sacrificial layer 14 defining a sacrificial portion 16 adjacent to anchor portion 18, a device 20 disposed completely over sacrificial portion 16, a first tether 30A that physically connects device 20 to anchor portion 18, and a second tether 30B that physically connects device 20 to anchor portion 18. First tether 30A is spatially separated from second tether 30B by a distance that is no greater than the combined length of first tether 30A and second tether 30B. In some embodiments, device 20 has a device length 22 and a device width 24, device length 22 extends along a device edge 21 to a device end 23, and device length 22 is longer than device width 24, for example device width 24 is no greater than one half of device length 22. Tether 30 can have a tether length and the tether length can be at least one third of the device length. Substrate 10 can comprise silicon {100}, device 20 can have a device bottom surface 24B adjacent to substrate 10 that is curved, bent, warped, or curled. Sacrificial portion 16 can be etched leaving recess 12.

Figure 27A:
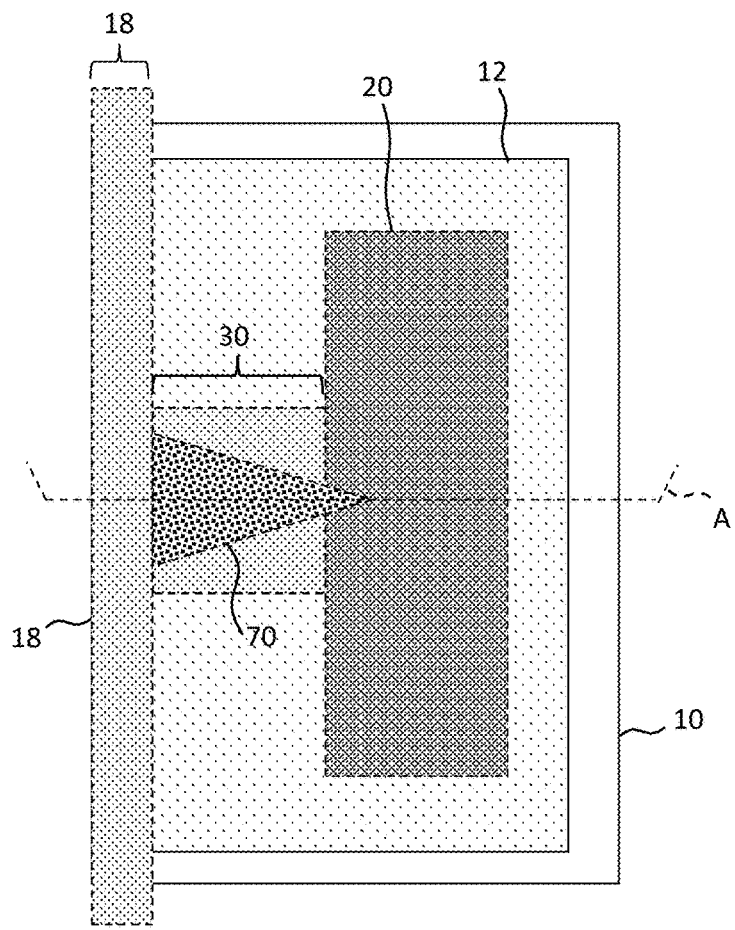
FIG. 27A is a plan view of a device structure and FIG. 27B is a cross section of the device structure of FIG. 27A taken across cross section line A useful in understanding illustrative embodiments of the present disclosure.
Figure 27B:
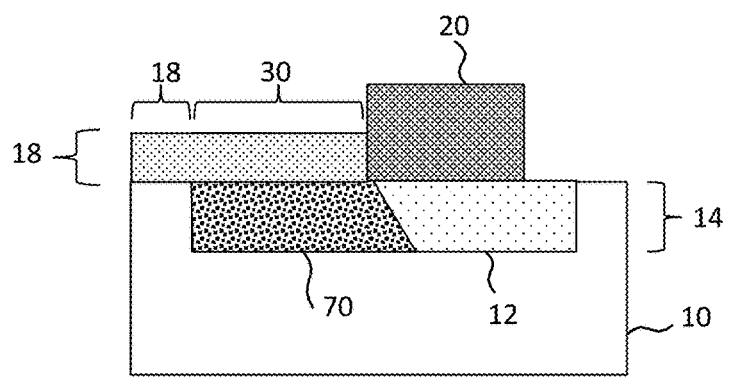

FIGS. 27A-29 illustrate etched structures that result when a relatively large tether 30 has an extended tether length 35 in the absence of tether opening 37. FIG. 27A is a schematic bottom view and FIG. 27B is a cross section of a device 20, anchor portion 18, tether 30, and recess (cavity) 12 structure that results when sacrificial layer 16 is partially etched to form recess 12 with no tether opening 37, for example when sacrificial portion 16 comprises crystalline silicon, such as silicon {100}. A roughly triangular wedge 70 of sacrificial portion 16 material remains beneath tether 30 and in physical contact with anchor portion 18 after etching sacrificial portion 16 to form cavity, recess, or gap 12 and releasing device 20 from substrate 10. Wedge 70 can eventually etch away but the etch time required is relatively lengthy compared to the time required to etch beneath device 20 and the etchant can therefore attack other structures, such as, in various embodiments, one or more of device 20, anchor portion 18, and other portions of tether 30. The presence of wedge 70 inhibits effective transfer printing of device 20 since tether 30 is not properly formed and device 20 can be incompletely released. As illustrated in FIG. 28A-28D, wedge 70 has two opposing parallel faces (e.g., a relatively small face in contact with and underside of tether 30 and the other relatively large face in contact with substrate 10) and angled side faces extending from substrate 10 (e.g., the floor of recess 12) to the underside of tether 30. FIG. 28A is a perspective of wedge 70 (with contrasting dashed lines showing a right-triangle point to more clearly illustrate the angled side faces) and FIG. 28B showing the same structure as FIG. 28A with the addition of orthogonal cross section lines A and B. FIG. 28C shows a cross section of wedge 70 taken along cross section line A of FIG. 28B and FIG. 28D show a cross section of wedge 70 taking along cross section line B of FIG. 28B. FIG. 29 is a micrograph of a wedge 70 formed during etching of sacrificial portion 16 under device 20.

In certain embodiments, a source wafer (substrate 10) can be any structure with a surface suitable for forming patterned sacrificial layers 14, sacrificial portions 16 (cavity 12), anchor portion(s) 18, and (e.g., patterned) device(s) 20. For example, source wafers 10 can comprise any anisotropically etchable material. Suitable semiconductor materials can be silicon or silicon with a {100} crystal structure (e.g., orientation). A surface of source wafer 10 surface can be substantially planar and suitable for photolithographic processing, for example as found in the integrated circuit or MEMs art.

In some embodiments of the present disclosure, devices 20 are small integrated circuits, for example chiplets, having a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns) and (iii) a length of 5-1000 microns (e.g., 5-10 microns, 10-50 microns, 50-100 microns, or 100-1000 microns). Such chiplets can be made in a native source semiconductor wafer (e.g., a silicon wafer) having a process side and a back side used to handle and transport the wafer using lithographic processes. The devices 20 can be formed using lithographic processes in an active layer on or in the process side of the source wafer 10. Methods of forming such structures are described, for example, in U.S. Pat. No. 8,889,485. According to some embodiments of the present disclosure, source wafers 10 can be provided with devices 20, sacrificial layer 14 (a release layer), and tethers 30 already formed, or they can be constructed as part of the process in accordance with certain embodiments of the present disclosure.

In some embodiments, devices 20 are piezoelectric devices formed on or in a semiconductor wafer, for example silicon, which can have a crystalline structure. Piezoelectric materials 54 can be deposited on source wafer 10, for example by sputtering, evaporation, or chemical vapor deposition. Suitable piezoelectric materials 54 can include aluminum nitride (AlN) or potassium sodium niobate (KNN) or other piezoelectric materials 54, such as lead zirconate titanate (PZT).

In certain embodiments, devices 20 can be constructed using foundry fabrication processes used in the art. Layers of materials can be used, including materials such as metals, oxides, nitrides and other materials used in the integrated-circuit art. Devices 20 can have different sizes, for example, less than 1000 square microns or less than 10,000 square microns, less than 100,000 square microns, or less than 1 square mm, or larger. Devices 20 can have, for example, at least one of a length, a width, and a thickness of no more than 500 microns (e.g., no more than 250 microns, no more than 100 microns, no more than 50 microns, no more than 25 microns, or no more than 10 microns). Devices 20 can have variable aspect ratios, for example at least 1:1, at least 2:1, at least 5:1, or at least 10:1. Devices 20 can be rectangular or can have other shapes.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components or devices, or where processes and methods are described as having, including, or comprising specific steps, it is contemplated that, additionally, there are apparatus, and systems of the disclosed technology that consist essentially of, or consist of, the recited components or devices, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
B cross section line
Cx convex corner
Cv concave corner
D distance
L length
L1, L2, L3 distance
P inverted pyramid
W width
10 substrate/source wafer
12 cavity/recess/gap
14 sacrificial layer
16 sacrificial portion
18 anchor portion/wall/cavity edge
20 device
20B device bottom surface
21 device edge
22 device length
23 device end
24 device width
30 tether
30A first tether
30B second tether
31 tether direction
32 centerline
33 tether edge
33A first tether edge
33B tether edge
34 tether device portion
35 tether length
36 tether substrate portion
37 tether opening
38 tether connection portion
40 branch
42 undivided tether portion
50 top electrode
52 bottom electrode
54 piezoelectric material
56 tether material
60 T-shape
62 crossbar
64 upright
70 wedge
80 encapsulation layer
97 device structure
98 wafer structure
99 suspended device structure
100 provide source wafer with sacrificial layer step
110 form device over sacrificial portions step
120 form tether step
130 etch sacrificial portions step

The invention claimed is:

1. A device structure, comprising:
a substrate having a sacrificial layer defining a sacrificial portion adjacent to an anchor portion;
a device disposed completely over the sacrificial portion;
a tether that physically connects the device to the anchor portion, the tether having a tether opening that extends entirely through the tether to the sacrificial portion and that laterally extends in a direction from the anchor portion toward the device.

2. The device structure of claim 1, wherein the tether opening is in contact with the anchor portion or extends into the anchor portion.

3. The device structure of claim 2, wherein the tether opening has a T-shape comprising an opening cross bar and an opening upright, and the opening cross bar is in contact with the anchor portion or extends into the anchor portion.

4. The device structure of claim 1, wherein the tether opening is in contact with the device.

5. The device structure of claim 4, wherein the tether opening has a T-shape comprising an opening cross bar and an opening upright, and the opening upright is in contact with the device.

6. The device structure of claim 1, wherein the device has a first edge having a device length and a second edge having a device width, the device length is longer than the device width, and the tether connects to the first edge.

7. The device structure of claim 6, wherein the device width is no greater than one half of the device length.

8. The device structure of claim 6, wherein the tether has a tether length in a direction parallel to the device length and the tether length is at least one third of the device length.

9. The device structure of claim 1, wherein the substrate comprises silicon {100}.

10. The device structure of claim 1, wherein the device has a device bottom adjacent to the substrate and the device bottom is bent, curved, curled, or warped.

11. A device structure, comprising:
a substrate;
a device disposed completely over a recess in the substrate;
a tether that physically connects the device to an anchor portion disposed on the substrate such that the device is suspended over the recess by the tether,
wherein the tether has a tether opening that extends entirely through the tether to the recess and that laterally extends in a direction from the anchor portion toward the device.

12. A device structure, comprising:
a substrate having a sacrificial layer defining a sacrificial portion adjacent to an anchor portion;
a device disposed completely over the sacrificial portion; and
a tether that physically connects the device to the anchor portion,
wherein the tether is a fracturable tether that has a T-shape comprising a tether crossbar and tether upright with the tether cross bar attached to or extending into the anchor portion.

13. The device structure of claim 12, wherein a tether opening is disposed in the tether that extends through the tether.

14. The device structure of claim 12, wherein the tether cross bar is in contact with or extends into the anchor portion.

15. The device structure of claim 12, wherein the tether upright is in contact with the device.

16. The device structure of claim 12, wherein the substrate comprises silicon {100}.

17. The device structure of claim 12, wherein the device has a device bottom adjacent to the substrate and the device bottom is bent, curved, curled, or warped.

18. The device structure of claim 12, wherein the device has a device length and a device width and the device width is no greater than one half of the device length.

19. The device structure of claim 12, wherein the tether has a tether length in a direction parallel to the device length and the tether length is at least one third of the device length.

20. A device structure, comprising:
a substrate;
a device disposed completely over a recess in or on the substrate; and
a tether that physically connects the device to an anchor portion disposed on the substrate such that the device is suspended over the recess by the tether,
wherein the tether is a fracturable tether that has a T-shape comprising a tether crossbar and tether upright with the tether cross bar attached to or extending into the anchor portion.

* * * * *